United States Patent
Tsutsumi et al.

(10) Patent No.: US 9,530,787 B2
(45) Date of Patent: Dec. 27, 2016

(54) BATCH CONTACTS FOR MULTIPLE ELECTRICALLY CONDUCTIVE LAYERS

(71) Applicant: SanDisk Technologies, Inc., Plano, TX (US)

(72) Inventors: Masanori Tsutsumi, Yokkaichi (JP); Naoki Ihata, Yokkaichi (JP); Shinsuke Yada, Yokkaichi (JP); Ryoichi Honma, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 109 days.

(21) Appl. No.: 14/518,430

(22) Filed: Oct. 20, 2014

(65) Prior Publication Data

US 2016/0111438 A1   Apr. 21, 2016

(51) Int. Cl.
*H01L 29/792* (2006.01)
*H01L 27/115* (2006.01)
*H01L 21/768* (2006.01)

(52) U.S. Cl.
CPC ... *H01L 27/11582* (2013.01); *H01L 21/76802* (2013.01); *H01L 21/76877* (2013.01); *H01L 27/1157* (2013.01); *H01L 27/11575* (2013.01)

(58) Field of Classification Search
None
See application file for complete search history.

(56) References Cited

U.S. PATENT DOCUMENTS

| | | | |
|---|---|---|---|
| 5,915,167 A | 6/1999 | Leedy | |
| 2011/0286275 A1* | 11/2011 | Jeon | G11C 16/0483 365/185.17 |
| 2015/0035036 A1* | 2/2015 | Konno | H01L 27/11565 257/314 |

OTHER PUBLICATIONS

U.S. Appl. No. 14/133,979, filed Dec. 19, 2013, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.

* cited by examiner

*Primary Examiner* — Pamela E Perkins
(74) *Attorney, Agent, or Firm* — The Marbury Law Group PLLC

(57) ABSTRACT

A stepped structure is formed on a stack of an alternating plurality of insulator layers and material layers such that at least two material layers have vertically coincident sidewalls. In one embodiment, the material layers can be electrically conductive layers, and a contact via structure can contact the vertically coincident sidewalls. In another embodiment, a sacrificial spacer can be formed on the vertically coincident sidewalls, and the material layers and the sacrificial spacer can be replaced with a conductive material. A contact via structure can be formed on a set of layers electrically shorted by a vertical conductive material portion that is formed in a volume of the spacer. The contact via structure can provide electrical contact to multiple electrically conductive layers.

11 Claims, 23 Drawing Sheets

BATCH CONTACTS FOR MULTIPLE ELECTRICALLY CONDUCTIVE LAYERS

FIELD

The present invention relates generally to the field of metal interconnect structures and specifically to metal interconnect structures including multiple electrically shorted conductive layers for vertical semiconductor devices and methods of making thereof.

BACKGROUND

Multilevel metal interconnect structures are routinely employed to provide electrical wiring for a high density circuitry, such as semiconductor devices on a substrate. Continuous scaling of semiconductor devices leads to a higher wiring density as well as an increase in the number of wiring levels. For example, a 3D NAND stacked memory device may include at least as many number of wiring levels as the total number of control gate electrodes employed for the 3D NAND stacked memory device. Each of the conductive layers in the wiring levels needs to be provided with an electrical contact.

SUMMARY

According to an aspect of the present disclosure, a multilevel structure is provided, which includes a stack of an alternating plurality of electrically conductive layers and insulator layers located over a substrate, and a plurality of contact via structures having top surfaces within a same horizontal plane and having bottom surfaces contacting a respective electrically conductive layer located at different levels. The multilevel structure further comprises a vertically extending conductive material portion contacting at least two electrically conductive layers and contacting each sidewall of at least one intervening insulator layer that is located between a topmost electrically conductive layer among the at least two electrically conductive layers and a bottommost electrically conductive layer among the at least two electrically conductive layers.

According to another aspect of the present disclosure, a method of fabricating a multilevel structure is provided. A stack including an alternating plurality of sacrificial material layers and insulator layers is formed over a substrate. The stack is patterned to form a stepped structure in which each overlying layer in the stack does not protrude more than any underlying layer in the stack. At least two electrically conductive layers within the stack have sidewalls that are vertically coincident among one another after formation of the stepped structure. A contact via structure is formed directly on surfaces of at least two electrically conductive layers within the stack.

According to yet another aspect of the present disclosure, a method of fabricating a multilevel structure is provided. A stack including an alternating plurality of sacrificial material layers and insulator layers is formed over a substrate. The stack is patterned to form a stepped structure in which each overlying layer in the stack does not protrude more than any underlying layer in the stack. At least two sacrificial material layers within the stack have vertically coincident sidewalls after formation of the stepped structure. A sacrificial spacer is formed on the vertically coincident sidewalls of the at least two electrically conductive layers. The materials of the sacrificial material layers and the sacrificial spacer are replaced with a conductive material. Electrically conductive layers are formed in volumes of the sacrificial material layers and a conductive material spacer is formed in a volume of the sacrificial spacer.

DETAILED DESCRIPTION

As discussed above, the present disclosure is directed to metal interconnect structures including multiple electrically shorted conductive layers for vertical semiconductor devices and methods of making the same, the various aspects of which are described below. The embodiments of the disclosure can be employed to form various structures including a multilevel metal interconnect structure, a non-limiting example of which includes semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

The various three dimensional memory devices of the present disclosure include a monolithic three-dimensional NAND string memory device, and can be fabricated employing the various embodiments described herein.

Figure 1:
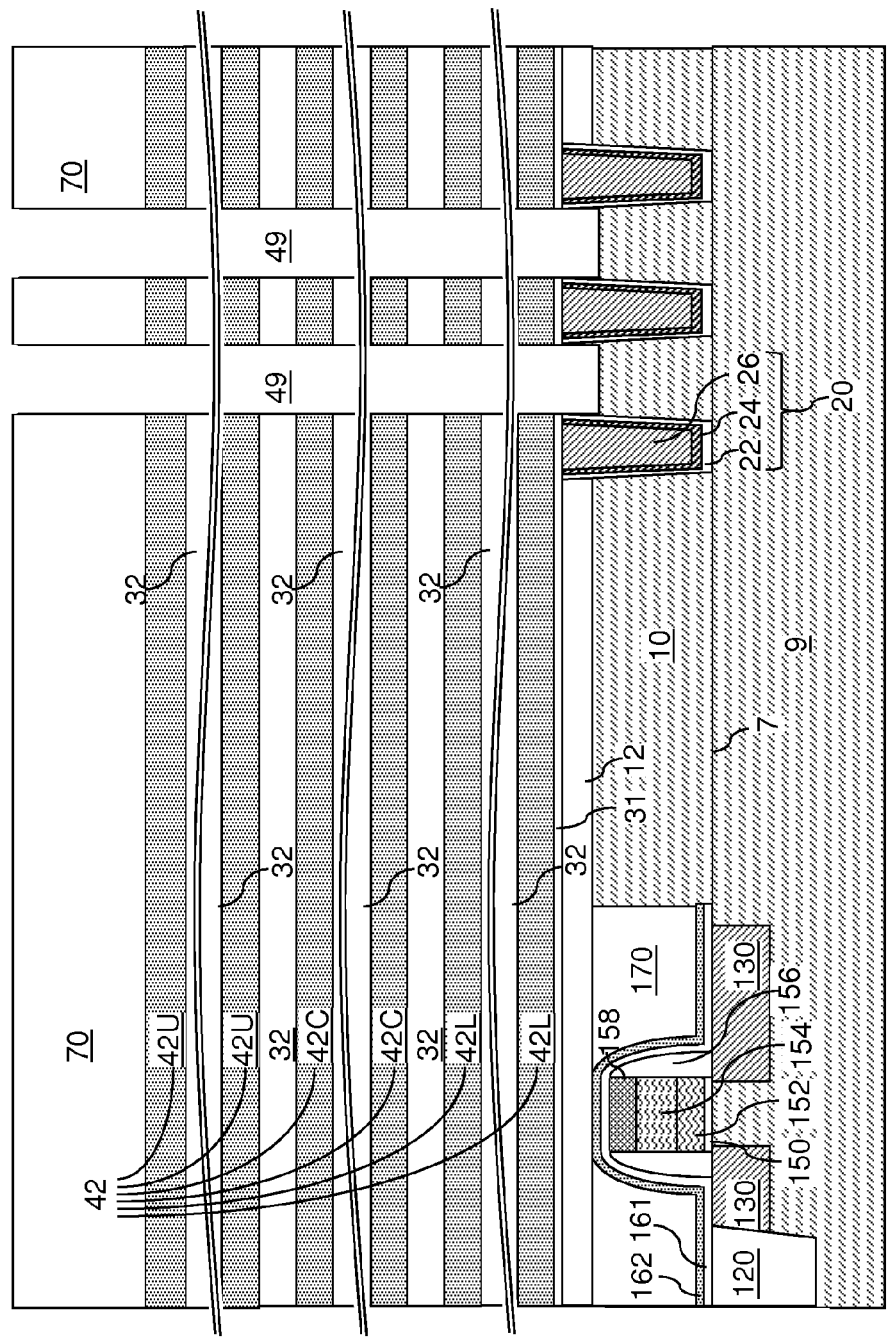
FIG. 1 is a vertical cross-sectional view of a first exemplary structure after formation of a stack of an alternating plurality of material layers and memory holes through the stack according to a first embodiment of the present disclosure.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-5}$ Ohm-cm to $1.0 \times 10^5$ Ohm-cm, and is capable of producing a doped material having electrical conductivity in a range from 1 Ohm-cm to $1.0 \times 10^5$ Ohm-cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than 1.0 Ohm-cm. As used herein, an "insulator material" or a "dielectric material" refers to a material having electrical conductivity less than $1.0 \times 10^{-5}$ Ohm-cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

Optionally, a semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

At least one optional shallow trench can be formed through the dielectric pad layer 12 and an upper portion of the semiconductor material layer 10. The pattern of the at least one shallow trench can be selected such that lower select gate electrodes can be subsequently formed therein. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

A lower select gate structure 20 can be formed in each of the at least one shallow trench, for example, by forming a gate dielectric layer and at least one conductive material layer, and removing portions of the gate dielectric layer and the at least one conductive material layer from above the top surface of the dielectric pad layer 12, for example, by chemical mechanical planarization. Each lower select gate structure 20 can include a gate dielectric 22 and a gate electrode (24, 26). In one embodiment, each gate electrode (24, 26) can include a metallic liner 24 and a conductive material portion 26. The metallic liner 24 can include, for example, TiN, TaN, WN, or a combination thereof. The conductive material portion 26 can include, for example, W, Al, Cu, or combinations thereof. At least one optional shallow trench isolation structure (not shown) and/or at least one deep trench isolation structure (not shown) may be employed to provide electrical isolation among various semiconductor devices that are present, or are to be subsequently formed, on the substrate.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

A stack of an alternating plurality of first material layers (which can be insulating layers 32) and second material layers (which can be sacrificial material layer (42L, 42C, 42U)) is formed over the top surface of the substrate, which can be, for example, on the top surface of the dielectric cap layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer 42. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material layers can include lower level second material layers formed at the levels of lower select gate electrodes to be subsequently formed, control gate level second material layers formed at the level of control gate electrodes to be subsequently formed, and upper level second material layers formed at the levels of upper select gate electrodes to be subsequently formed. For example, the lower level second material layers can be lower level sacrificial material layers 42L, the control gate level second material layers can be control gate level sacrificial material layers 42C, and the upper gate second material layers can be upper level sacrificial material layers 42U. The lower level sacrificial material layers 42L, the control gate level sacrificial material layers 42C, and the upper level sacrificial material layers 42U collectively constitute the sacrificial material layers 42, which, in conjunction with the insulator layers 32, form the alternating stack (32, 42).

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an electrically insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including at least one of silicon and germanium.

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, a insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulator layers 32 as described above. The insulating cap layer 70 can have a greater thickness than each of the insulator layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

Figure 2:
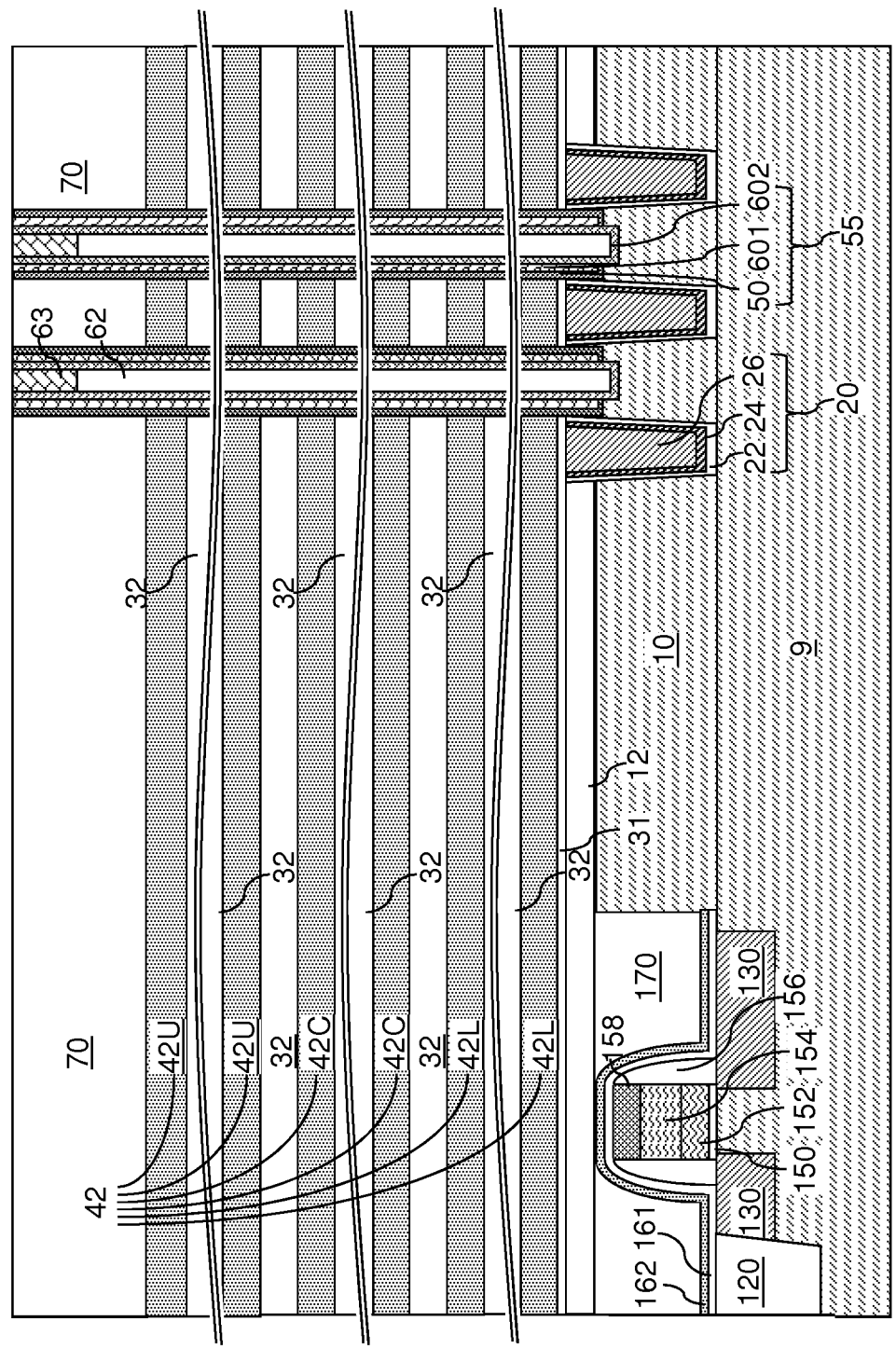
FIG. 2 is a vertical cross-sectional view of the first exemplary structure after formation of memory stack structures according to the first embodiment of the present disclosure.

Referring to FIG. 2, a memory stack structure 55 can be formed within each memory opening through the alternating stack (32, 42). The memory stack structures 55 can be formed, for example, by depositing a memory film layer in the memory openings and over the alternating stack (32, 42), and by anisotropically etching the memory film layer. The memory film layer can be a stack of contiguous material layers that overlie the entirety of the alternating stack (31, 42,). The memory film layer contacts all sidewall surface(s) and all bottom surface(s) of the memory openings. The memory film layer is a contiguous film stack that provides the functionality of charge storage in the absence of an external electrical bias voltage, while enabling charge transfer in the presence of a suitable external electrical bias voltage.

In one embodiment, the memory film layer can be a stack, in the order of formation, of a blocking dielectric layer, a charge storage layer, and a tunnel dielectric layer. In one embodiment, a plurality of floating gates or a charge storage dielectric can be located between the tunneling dielectric layer and the blocking dielectric layer.

The blocking dielectric layer contacts the sidewalls of the memory openings. Specifically, the blocking dielectric layer can contact the sidewalls of the sacrificial layers 42. The blocking dielectric layer may include one or more dielectric material layers that can function as the dielectric material(s) of a control gate dielectric between the sacrificial layers 42 and charge storage regions to be subsequently formed out of the charge storage layer. The blocking dielectric layer can include silicon oxide, a dielectric metal oxide, a dielectric metal oxynitride, or a combination thereof. In one embodiment, the blocking dielectric layer can include a stack of at least one silicon oxide layer and at least one dielectric metal oxide layer. The blocking dielectric layer can be formed by a conformal deposition process such as chemical vapor deposition (CVD) and/or atomic layer deposition (ALD), and/or by deposition of a conformal material layer (such as an amorphous silicon layer) and subsequent conversion of the conformal material layer into a dielectric material layer (such as a silicon oxide layer). The thickness of the blocking dielectric layer can be in a range from 6 nm to 24 nm, although lesser and greater thicknesses can also be employed. Alternatively, the blocking dielectric layer may be omitted from the memory opening, and instead be formed through the backside contact trench in recesses formed by removal of the sacrificial layers 42 prior to forming the metal control gate electrodes through a backside contact trench.

The charge storage layer includes a dielectric charge trapping material, which can be, for example, silicon nitride, or a conductive material such as doped polysilicon or a metallic material. In one embodiment, the charge storage layer includes silicon nitride. The charge storage layer can be formed as a single charge storage layer of homogeneous composition, or can include a stack of multiple charge storage material layers. The multiple charge storage material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer may comprise an insulating charge trapping material, such as one or more silicon nitride segments. Alternatively, the charge storage layer may comprise conductive nanoparticles such as metal nanoparticles, which can be, for example, ruthenium nanoparticles. The charge storage layer can be formed, for example, by chemical vapor deposition (CVD), atomic layer deposition (ALD), physical vapor deposition (PVD), or any suitable deposition technique for the selected material(s) for the charge storage layer. The thickness of the charge storage layer can be in a range from 2 nm to 20 nm, although lesser and greater thicknesses can also be employed.

The tunnel dielectric layer includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer can include a stack of a first silicon oxide layer, a silicon oxynitride layer, and a second silicon oxide layer, which is commonly known as an ONO stack. In one embodiment, the tunneling dielectric layer can include a silicon oxide layer that is substantially free of carbon or a silicon oxynitride layer that is substantially free of carbon. The thickness of the tunnel dielectric layer can be in a range from 2 nm to 20 nm, although lesser and greater thicknesses can also be employed.

Optionally, a permanent channel material layer (such as a polysilicon layer) and/or a sacrificial layer (such as a dielectric material layer) may be formed on the memory film layer. The memory film layer (and any additional layer such as a permanent channel material layer or a sacrificial layer) can be anisotropically etched so that horizontal portions of the memory film layer (and any additional layer) are removed from above the top surface of the alternating stack (32, 42) and at the bottom of each memory opening. Each remaining vertical portion of the memory film layer that remains within a memory opening after the anisotropic etch constitutes a memory film 50. Each memory film 50 can be homeomorphic to a torus. As used herein, an element is homeomorphic to a geometrical shape if the shape of the element can be mapped to the geometrical shape by continuous deformation without creation or destruction of any hole. If the first electrode 12 underlies the memory openings, a top surface of the first electrode 12 can be physically exposed within the cavity defined by the inner sidewalls of an overlying memory film 50.

A semiconductor channel (601, 602) can be formed by depositing at least one semiconductor material on the inner sidewalls of the memory films 50 and on semiconductor surfaces of the semiconductor material layer 10 at the bottom of the memory openings. In an illustrative example, a first semiconductor channel layer can be deposited directly on the surfaces of the memory films 50 by a conformal deposition method such as chemical vapor deposition (CVD). The first semiconductor channel layer and the memory films can be anisotropically etched to form an opening at a bottom portion of each memory opening. A top surface of the substrate semiconductor layer 10 is physically exposed at the bottom of each memory opening. Each remaining portion of the first semiconductor channel layer within a memory opening constitutes a first semiconductor channel portion 601. A second semiconductor channel layer can be deposited on the sidewalls of the first semiconductor channel portions 601, physically exposed surfaces of the substrate semiconductor layer 10 within the memory openings, and over the insulating cap layer 70. The semiconductor material of the second semiconductor channel layer can include a doped polycrystalline semiconductor material (such as doped polysilicon), or can include a doped amorphous semiconductor material (such as amorphous silicon) that can be subsequently converted into a doped polycrystalline semiconductor material after a suitable anneal at an elevated temperature.

Optionally, a dielectric core 62 can be formed within a cavity inside each semiconductor channel 60, for example, by deposition of a dielectric material such as silicon oxide, and subsequent planarization of the dielectric material. The planarization of the dielectric material removes the portion of the deposited dielectric material from above the top surface of the horizontal plane including the top surface of the insulating cap layer 70. The planarization of the dielectric material can be performed, for example, by chemical mechanical planarization. Each remaining portion of the dielectric material inside a memory opening constitutes a dielectric core 62. The dielectric core 62 is an optional component, and a combination of a memory film 50 and a semiconductor channel 60 may completely fill a memory opening.

The horizontal portion of the second semiconductor channel layer above the top surface of the insulating cap layer 70 can be removed, for example, by a recess etch. Each remaining portion of the second semiconductor channel layer constitutes a second semiconductor channel 602. Each adjoined pair of a first semiconductor channel 601 and a second semiconductor channel vertically extend through the alternating stack (32, 42), and collectively constitutes a portion of a semiconductor channel (601, 602) for a memory stack structure 55. A set of a memory film 50 and a semiconductor channel (601, 602) within a same memory opening constitutes a memory stack structure 55.

Drain regions 63 can be formed by recessing a top portion of each dielectric core and depositing a doped semiconductor material. The doped semiconductor material can be, for example, doped polysilicon. Excess portions of the deposited semiconductor material can be removed from above the top surface of the alternating stack (32, 42), for example, by chemical mechanical planarization (CMP) or a recess etch.

Figure 3:
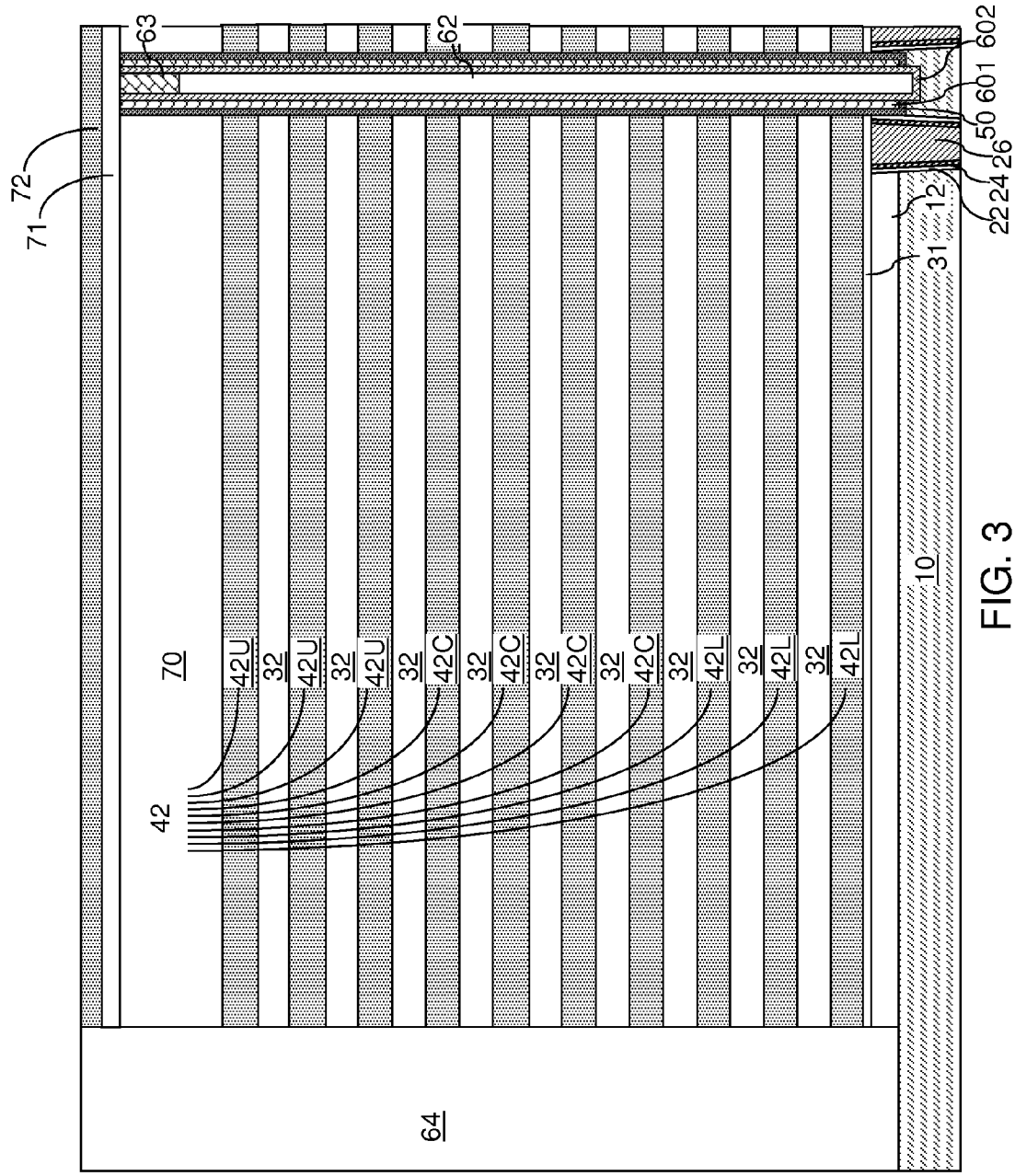
FIG. 3 is a vertical cross-sectional view of the first exemplary structure after formation of an optional dielectric material portion according to the first embodiment of the present disclosure.

Referring to FIG. 3, at least one dielectric cap layer (71, 72) can be optionally formed over the insulating cap layer 70. In one embodiment, the at least one dielectric cap layer (71, 72) can include a first dielectric cap layer 71 and a second dielectric cap layer 72. In one embodiment, the first and second dielectric cap layers (71, 72) can include dielectric materials such as silicon oxide, a dielectric metal oxide, and/or silicon nitride.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed. Subsequently, the trench can be filled with an optional dielectric material such as silicon oxide. Excess portions of the dielectric material can be removed from above the top surface of the insulating cap layer 70 by a planarization process such as chemical mechanical planarization and/or a recess etch. The top surfaces of the at least one dielectric cap layer (71, 72) can be employed as a stopping surface during the planarization. The remaining dielectric material in the trench constitutes a dielectric material portion 64.

Figure 4:
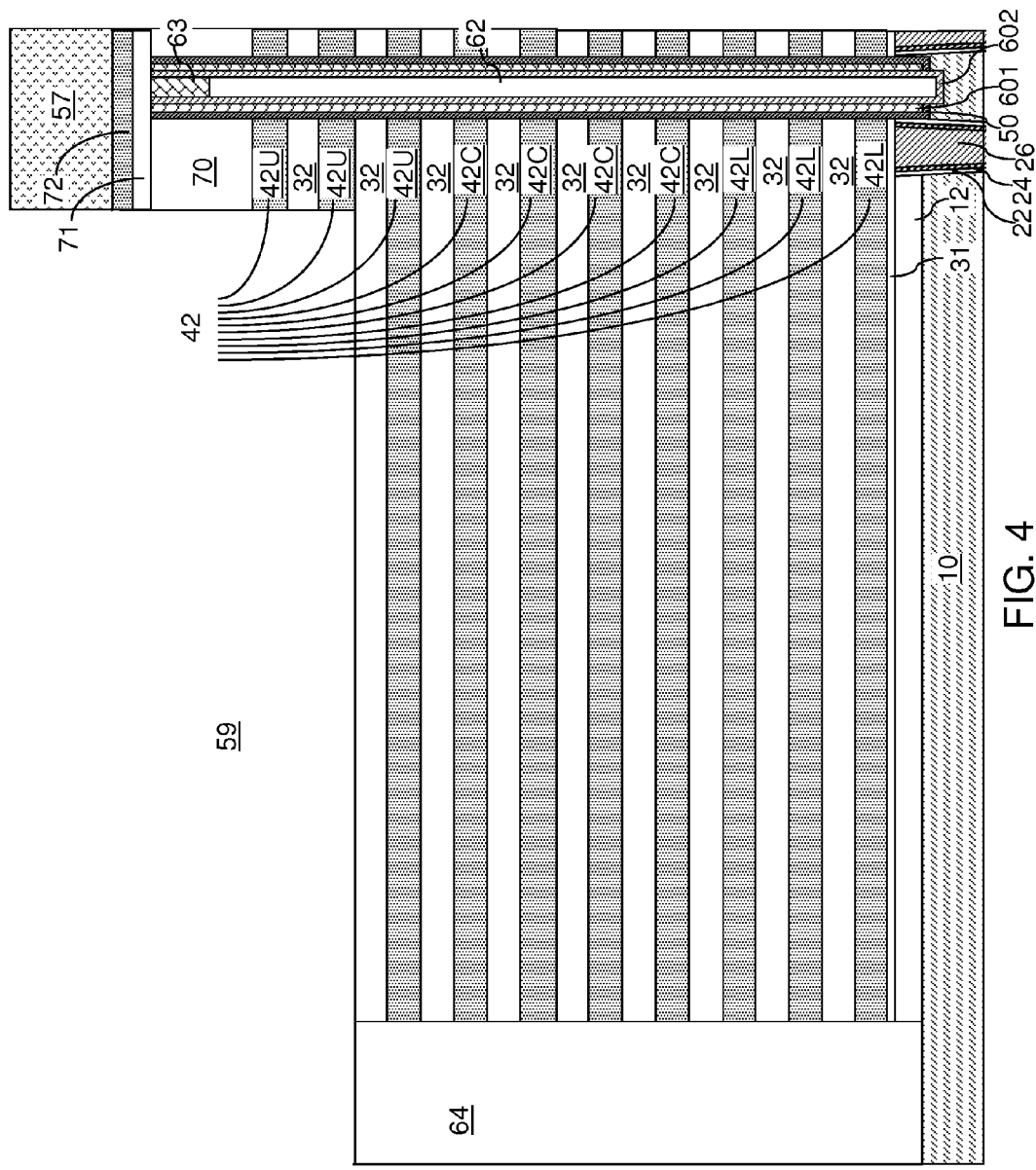
FIG. 4 is a vertical cross-sectional view of the first exemplary structure after formation of a patterned mask layer and a via cavity according to the first embodiment of the present disclosure.

Referring to FIG. 4, a trench 59 can be formed through portions of the at least one dielectric cap layer (71, 72), the insulating cap layer 70, and at least one sacrificial material layer 42. For example, a first photoresist layer 57 can be applied over the at least one dielectric cap layer (71, 72) and the dielectric material portion 64, and can be lithographically patterned to form an opening therein. The opening in the first photoresist layer 57 may overlie a boundary between the alternating stack (32, 42) and the dielectric material portion 64. The opening in the first photoresist layer 57 can encompass an entire area of a contact region in which contact via structures are to be subsequently formed.

The pattern of the opening in the first photoresist layer 57 can be transferred by an anisotropic etch process through the at least one dielectric cap layer (71, 72), the insulating cap layer 70, and one or more sacrificial material layers 42, and a region of the dielectric material portion 64, and optionally at least one insulator layer 32. Depending on the number of sacrificial material layers 42 etched during the anisotropic etch process, only a subset of the upper level sacrificial material layers 42U may be etched among the sacrificial material layers 42, or the upper level sacrificial material layers 42U and one or more of the control gate level sacrificial material layers 42C may be etched among the sacrificial material layers 42.

In one embodiment, the number of the upper level sacrificial material layers 42U that are etched through may be the same as the total number n2 of the upper level sacrificial material layers 42U within the alternating stack (32, 42) less one, i.e., n2−1. In another embodiment, the number of the upper level sacrificial material layers 42U that are etched through may be the same as the total number n2 of the upper level sacrificial material layers 42U within the alternating stack (32, 42), i.e., n2. While the present disclosure is described employing an embodiment in which three upper sacrificial material layers 42U are present, embodiments in which the total number n2 of upper level sacrificial material layers 42U is 2, 4, or an integer greater than 4 are also contemplated herein. In one embodiment, the total number n2 of the upper level sacrificial material layers 42U can be the same as the total number n1 of lower level sacrificial material layers 42L.

The anisotropic etch employed to transfer of the pattern in the first photoresist layer 57 can be a reactive ion etch. In this case, the sidewalls of the trench 59 can be substantially vertical. The chemistry and duration of the anisotropic etch process are selected such that the anisotropic etch stops after etching through the (n2−1)-th sacrificial material layer 42, or after etching through the n2-th sacrificial material layer 42, which is the bottommost upper level sacrificial material layer 42U. In an illustrative example, if the insulator layers 32 include silicon oxide and if the sacrificial material layers 42 include silicon nitride, the chemistry and duration of the anisotropic etch process can be selected to etch through the at least one dielectric cap layer (71, 72), the insulating cap layer 70, and the alternating layers of silicon nitride and silicon nitride until the (n2−1)-th upper level sacrificial material layer 42U (as counted from the top) is etched through, or until the bottommost upper level sacrificial material layer 42U is etched through. The anisotropic etch can stop on the insulator layer 32 that is located directly underneath the last-etched sacrificial material layer, which can be the (n2−1)-th sacrificial material layer 42 (as counted from the top). The physically exposed sidewalls of the insulator layer(s) 32 and the upper level sacrificial material layers 42U can be vertically coincident. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down. The first photoresist layer 57 can be subsequently removed selective to the insulating cap layer 70, the sacrificial material layers 42, and the insulator layers 32, for example, by ashing.

Figure 5:
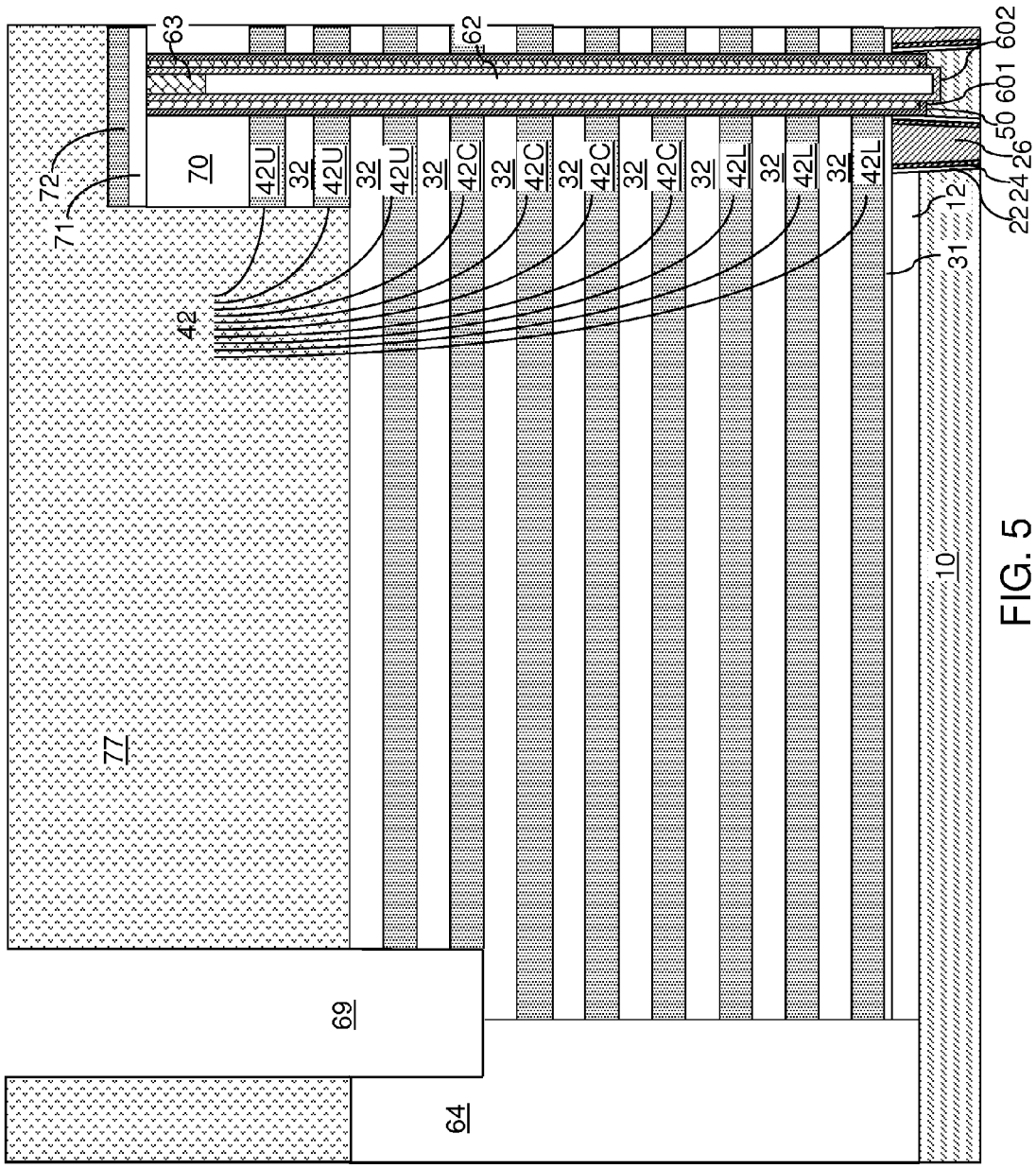
FIG. 5 is a vertical cross-sectional view of the first exemplary structure after recessing of the patterned mask layer and an anisotropic etch that vertically recesses the via cavity according to the first embodiment of the present disclosure.

Referring to FIG. 5, a second patterned mask layer can be formed over the exemplary structure, and a trench 69 replicating the pattern in the second patterned mask layer can be formed through a portion of the alternating stack (32, 42) and optionally through a portion of the dielectric material portion 64. For example, a second photoresist layer 77 can be applied over the at least one dielectric cap layer (71, 72) and the dielectric material portion 64, and can be lithographically patterned to form an opening therein. The opening in the second photoresist layer 77 may overlie a boundary between the alternating stack (32, 42) and the dielectric material portion 64. In one embodiment, the opening in the second photoresist layer 77 may be located entirely within the area of the trench 59 as formed at the end of the processing steps of FIG. 4.

The pattern of the opening in the second photoresist layer 77 can be transferred by an anisotropic etch process through at least one insulator layer 32 and at least one sacrificial material layers 42, and optionally, a region of the dielectric material portion 64. Depending on the number of sacrificial material layers 42 etched during the anisotropic etch process, at least one upper level sacrificial material layers 42U and/or at least one control gate level sacrificial material layers 42C may be etched.

In one embodiment, the number of the sacrificial material layers 42 that are etched through may be the same as the total number n1 of the lower level sacrificial material layers 42L within the alternating stack (32, 42) less one, i.e., n1−1. In another embodiment, the number of the sacrificial material layers 42 that are etched through may be the same as the total number n1 of the lower level sacrificial material layers 42L within the alternating stack (32, 42), i.e., n1. While the present disclosure is described employing an embodiment in which three lower sacrificial material layers 42L are present, embodiments in which the total number n1 of lower level sacrificial material layers 42L is 2, 4, or an integer greater than 4 are also contemplated herein. In one embodiment, the total number n2 of the upper level sacrificial material layers 42U can be the same as the total number n1 of lower level sacrificial material layers 42U.

The anisotropic etch employed to transfer of the pattern in the second photoresist layer 77 can be a reactive ion etch. In this case, the sidewalls of the trench 69 can be substantially vertical. The chemistry and duration of the anisotropic etch process are selected such that the anisotropic etch stops after etching through a combination of n1 insulator layers 32 and (n1−1) sacrificial material layers 42, or after etching through n1 insulator layers 32 and n1 sacrificial material layers 42. In an illustrative example, if the insulator layers 32 include silicon oxide and if the sacrificial material layers 42 include silicon nitride, the chemistry and duration of the anisotropic etch process can be selected to alternately etch through (n1−1) pair(s) of insulator layers 32 and sacrificial material layers 42, or through n1 pair(s) of insulator layers 32 and sacrificial material layers 42. The anisotropic etch can stop on the insulator layer 32 that is located directly underneath the last-etched sacrificial material layer. The physically exposed sidewalls of the insulator layer(s) 32 and the upper level sacrificial material layers 42 can be vertically coincident.

Figure 6:
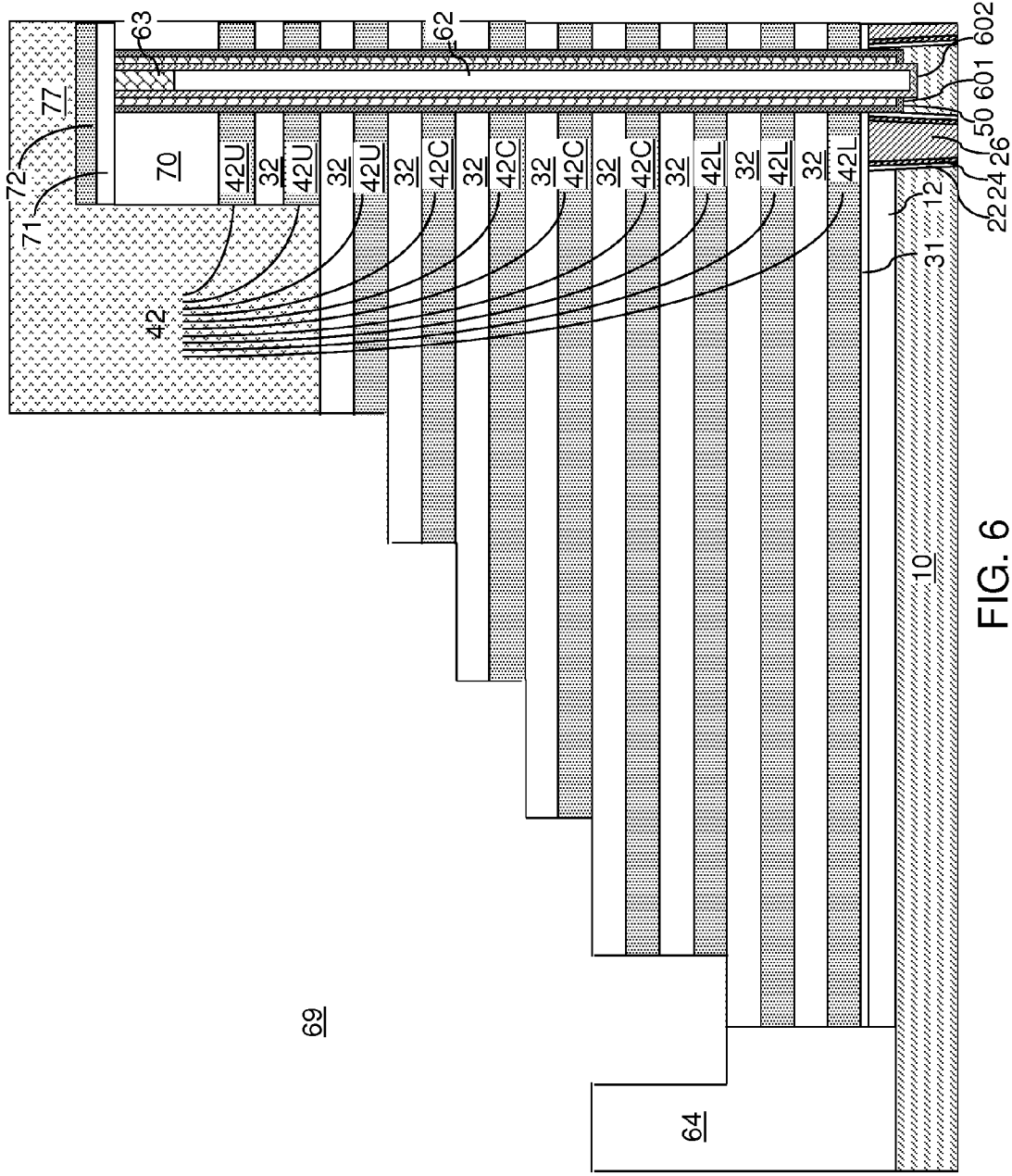
FIG. 6 is a vertical cross-sectional view of the first exemplary structure after formation of a set of stepped surfaces and a stepped via cavity according to the first embodiment of the present disclosure.

Referring to FIG. 6, multiple sets of processing steps are repeatedly performed to alternately provide a set of stepped surfaces. Each set of processing steps includes a first processing step of isotropic recessing of the second photoresist layer 77 and a second processing step of vertical recessing of the trench 69 by one level (i.e., a pair of an insulator layer 32 and a sacrificial material layer 42) can be repeatedly performed.

During the first processing step of the first set of processing steps, the second photoresist layer 77 can be isotropically recessed employing an isotropic etch process, which can be a wet etch process employing a slow-etching solvent, or can be a dry etch process. The top surface and the sidewalls of the photoresist layer can be isotropically recessed. The size of the opening in the second photoresist layer 77 can be expanded. Alternatively, the second photoresist layer 77 as employed at the processing step of FIG. 5 may be removed, for example, by ashing, and a new second photoresist layer 77 can be applied and patterned to provide an opening having a greater lateral extent than the lateral extent of the trench 69 as provided at the end of the processing steps of FIG. 5. In one embodiment, the lateral extent of the opening in the photoresist layer 77 can be greater than the lateral extent of the trench 69 as provided at the end of the processing steps of FIG. 5 in all horizontal directions so that the entire area of the trench 69 is within the opening of the second photoresist layer 77 at this processing step.

During the second processing step of the first set of processing steps, an anisotropic etch process is performed to etch through the material of each portion of the insulator layers 32 having a physically exposed top surface within the opening in the second photoresist layer 77, and then to etch through the material of each portion of the sacrificial material layers 42 having a physically exposed top surface within the opening in the second photoresist layer 77. The trench 69 after the anisotropic etch process includes steps, and is herein referred to as a stepped trench 69.

As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped trench" refers to a trench having stepped surfaces.

Subsequently, additional sets of processing steps can be repeated performed, each of which includes a first processing step of providing a patterned mask layer having an opening of a greater lateral extent than previously formed patterned mask layers, and a second processing step of performing an anisotropic etch process. In one embodiment, the lateral extent of the opening in the second photoresist layer 77 provided at each first processing step can be greater than the lateral extent of the stepped trench 69 as provided at the end of previous processing steps in all horizontal directions. Thus, at the end of a first processing step, the entire area of the stepped trench 69 is within, and is less than, the opening of the second photoresist layer 77 as recessed during the first processing step. In one embodiment, successive trimming of the same second photoresist layer 77 can be employed. In another embodiment, multiple second photoresist layers 77 may be employed.

Each anisotropic etch process removes physically exposed portions of the insulator layers 32, and physically exposed portions of sacrificial material layers 42. The amount of removal corresponds to the thickness of one insulator layer 32 and one sacrificial material layer 42. Performing one set of processing steps vertically recesses the depth of a pre-existing portion of the stepped cavity 69 by one level. As used herein, a "level" of a structure including alternating plurality is defined as the relative position of a pair of a first material layer and a second material layer within the structure, which can be the relative position of a pair of an insulator layer 32 and a sacrificial material layer 42.

Figure 7:
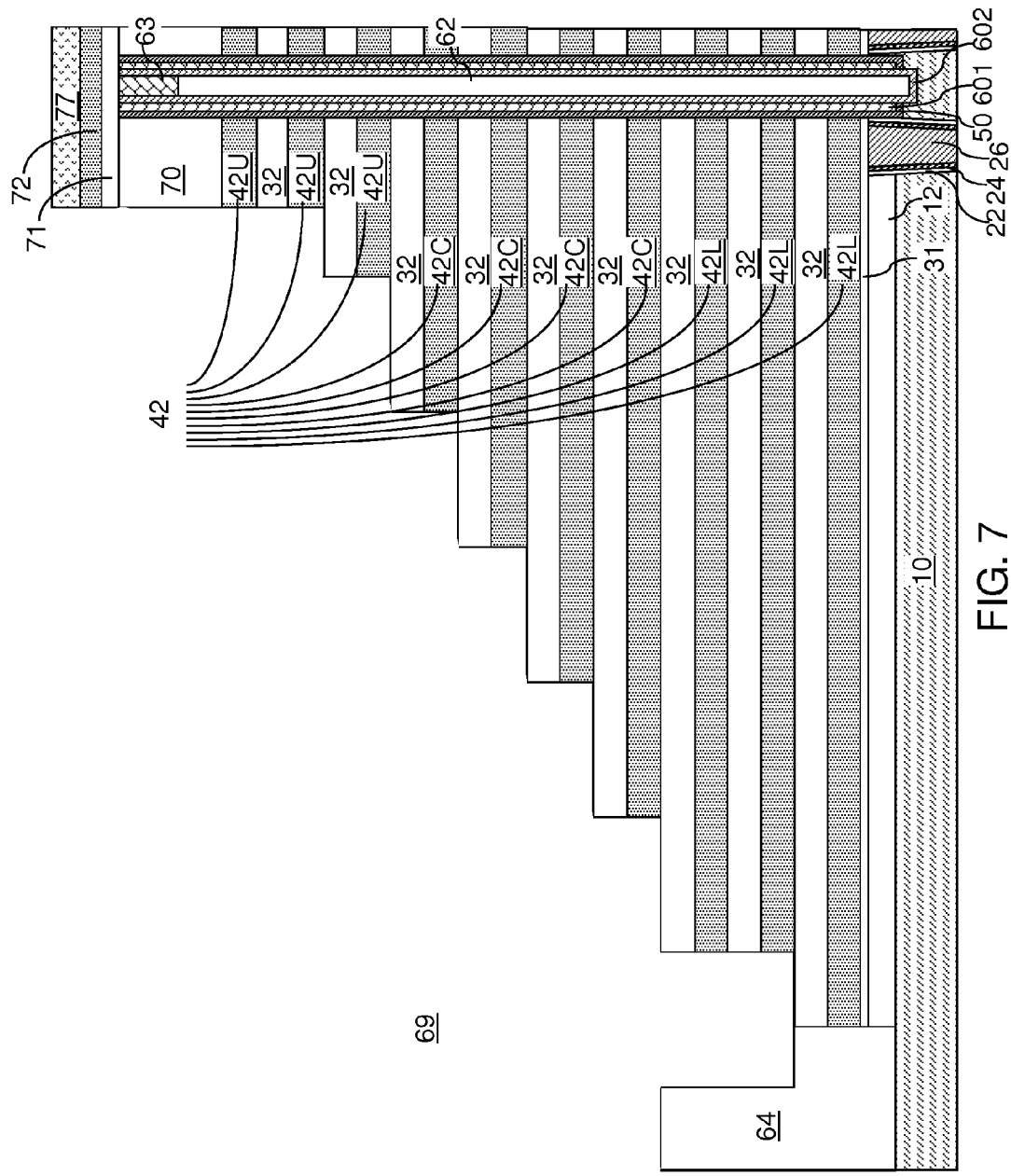
FIG. 7 is a vertical cross-sectional view of the first exemplary structure after formation of a set of stepped surfaces and a stepped via cavity including an upper multilevel step and a lower multi-level step according to the first embodiment of the present disclosure.

Referring to FIG. 7, the set of processing steps are repeatedly performed until the total number of unetched sacrificial material layers 42 (i.e., sacrificial material layers 42 of which no portion has been etched) becomes 1 or 0. The second photoresist layer 77 can be subsequently removed, for example, by ashing.

After the anisotropic etch process, the alternating stack (32, 42) constitutes a stepped structure in which each overlying layer in the alternating stack (32, 42) does not protrude more than any underlying layer in the alternating stack (32, 42). In one embodiment, (n1−1) lower level sacrificial material layers 42L and (n1−1) insulator layers 32 can have vertically coincident sidewalls at a bottom portion of the stepped structure. In another embodiment, n1 lower level sacrificial material layers 42L and n1 insulator layers 32 can have vertically coincident sidewalls at a bottom portion of the stepped structure. In one embodiment, (n2−1) upper level sacrificial material layers 42U and (n2−1) insulator layers 32 can have vertically coincident sidewalls at an upper portion of the stepped structure. In another embodiment, n2 upper level sacrificial material layers 42U and n2 insulator layers 32 can have vertically coincident sidewalls at an upper portion of the stepped structure.

Figure 8:
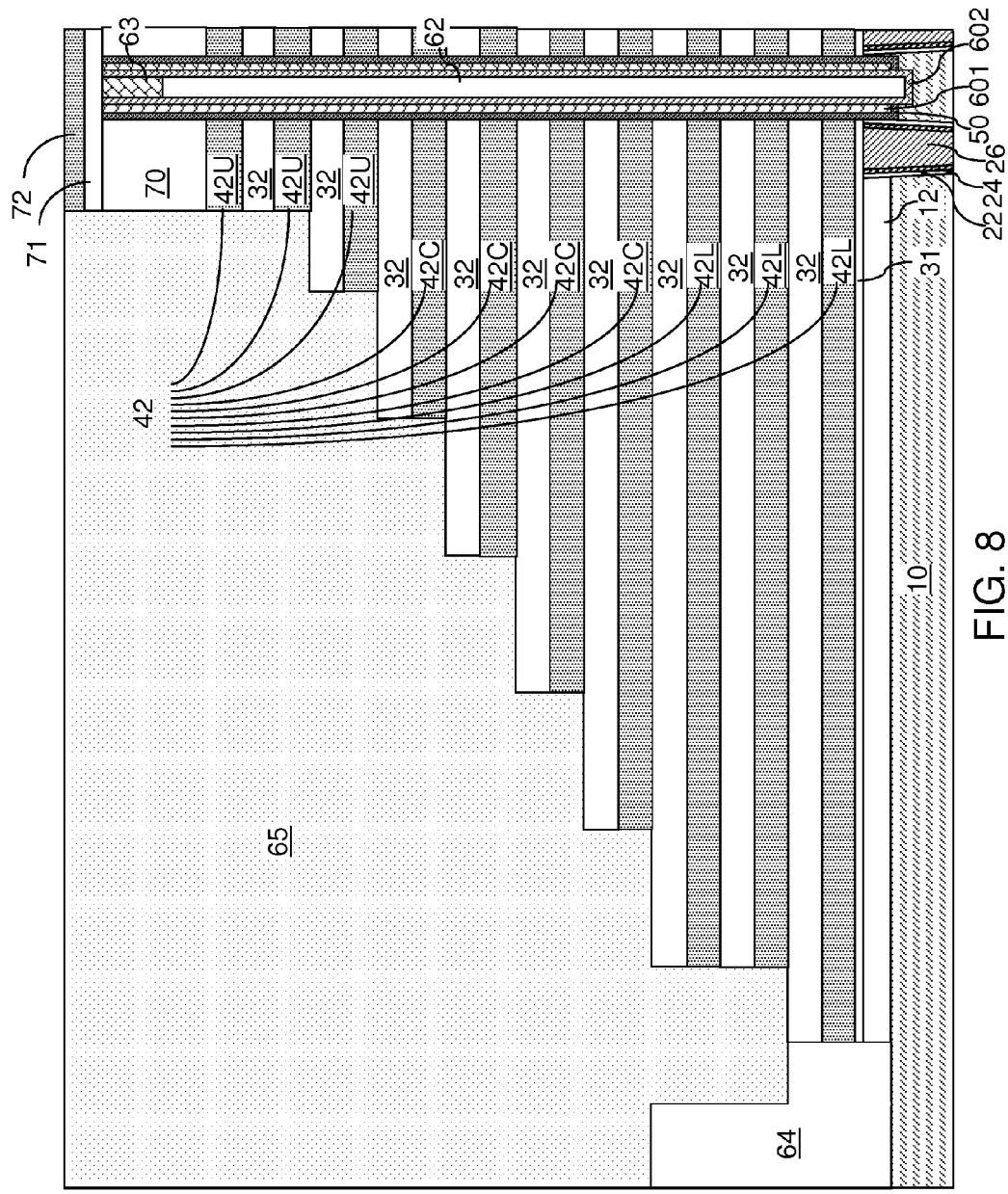
FIG. 8 is a vertical cross-sectional view of the first exemplary structure after formation of a retro-stepped dielectric material portion according to the first embodiment of the present disclosure.

Referring to FIG. 8, a dielectric material portion 65 (i.e., insulating fill material portion) can be formed in the stepped cavity 69 by deposition of a dielectric material therein. A dielectric material such as silicon oxide can be deposited in the stepped cavity 69. Excess portions of the deposited dielectric material can be removed from above the top surface of the at least one dielectric cap layer (71, 72), for example, by chemical mechanical planarization (CMP). The remaining portion of the deposited dielectric material filling the stepped cavity 69 constitutes the dielectric material portion 65. The dielectric material portion 65 is formed over the stepped structure of the alternating stack (32, 42), and can have a planar top surface.

The dielectric material portion 65 is retro-stepped, i.e., is a retro-stepped dielectric material portion. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 9:
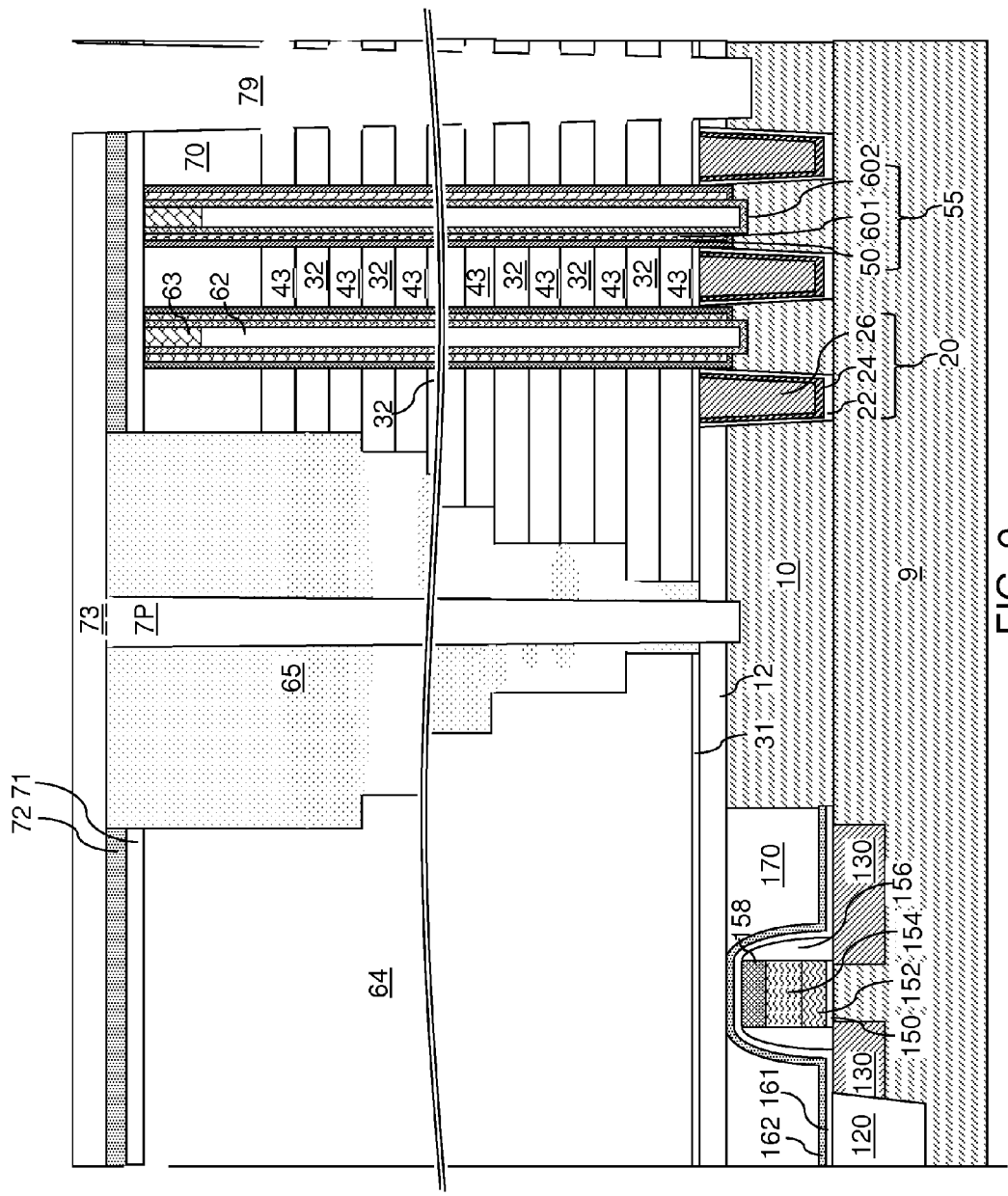
FIG. 9 is a vertical cross-sectional view of the first exemplary structure after formation of an optional dielectric pillar structure, a backside via cavity, and backside recesses according to the first embodiment of the present disclosure.

Referring to FIG. 9, at least one dielectric support pillar 7P may be optionally formed through the retro-stepped dielectric material portion 65 and/or through the alternating stack (32, 42). The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42. In one embodiment, the at least one dielectric support pillar can include silicon oxide and/or a dielectric metal oxide such as aluminum oxide. In one embodiment, the portion of the dielectric material that is deposited over the at least one dielectric cap layer (71, 72) concurrently with deposition of the at least one dielectric support pillar 7P can be present over the at least one dielectric cap layer (71, 72) as a dielectric pillar material layer 73. The dielectric pillar material layer 73 and the at least one dielectric support pillar 7P can be formed as a single contiguous structure of integral construction, i.e., without any material interface therebetween. In another embodiment, the portion of the dielectric material that is deposited over the at least one dielectric cap layer (71, 72) concurrently with deposition of the at least one dielectric support pillar 7P can be removed, for example, by chemical mechanical planarization or a recess etch. In this case, the dielectric pillar material layer 73 is not present, and the top surface of the at least one dielectric cap layer (71, 72) can be physically exposed.

A photoresist layer (not shown) can be applied over the alternating stack (32, 42) and/or the retro-stepped dielectric material portion 65, and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. If desired, a source region (not shown) may be formed by implantation of dopant atoms into a portion of the substrate semiconductor layer 10 through the backside contact trench 79.

An etchant that selectively etches the second material of the sacrificial material layers 42 with respect to the first material of the insulator layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulator layers 32, the material of the at least one dielectric support pillar 7P, the material of the retro-stepped dielectric material portion 65, the semiconductor material of the substrate semiconductor layer 10, and the material of the outermost layer of the memory films 50. In one embodiment, the sacrificial material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulator layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region comprises an array of monolithic three dimensional NAND strings having a plurality of device levels disposed above the substrate (9, 10). In this case, each backside recess 43 can define a space for receiving a respective word line of the array of monolithic three dimensional NAND strings.

Each of the plurality of backside recesses 43 can extend substantially parallel to the top surface of the substrate (9, 10). A backside recess 43 can be vertically bounded by a top surface of an underlying insulator layer 32 and a bottom surface of an overlying insulator layer 32. In one embodiment, each backside recess 43 can have a uniform height throughout.

Figure 10:
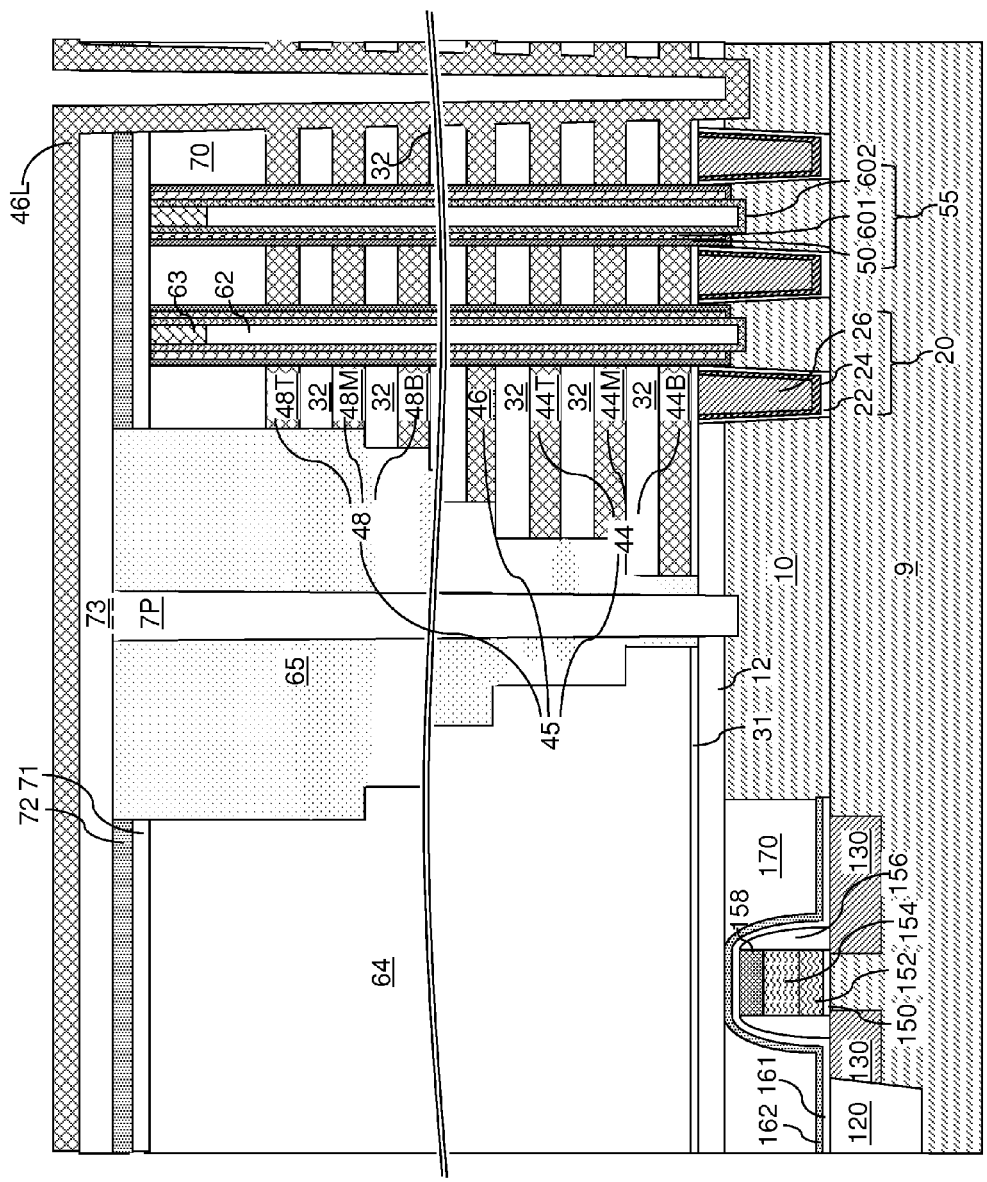
FIG. 10 is a vertical cross-sectional view of the first exemplary structure after formation of electrically conductive lines according to the first embodiment of the present disclosure.

Referring to FIG. 10, a conductive material can be deposited in the plurality of backside recesses 43, on sidewalls of the at least one the backside contact trench 79, and over the top surface of the dielectric pillar material layer 73 (or the topmost layer of the exemplary structure in case the dielectric pillar material layer 73 is not employed). As used herein, a conductive material refers to an electrically conductive material. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses 43 include tungsten, tungsten nitride, titanium, titanium nitride, tantalum, and tantalum nitride. In one embodiment, the conductive material can comprise a metal such as tungsten and/or metal nitride. In one embodiment, the conductive material for filling the plurality of backside recesses 43 can be selected from tungsten and a combination of titanium nitride and tungsten. In one embodiment, the conductive material can be deposited by chemical vapor deposition.

A plurality of electrically conductive layers 45 is present in the plurality of backside recesses 43, and an electrically conductive layer 46L can be formed on the sidewalls of each backside contact trench 79 and over the dielectric pillar material layer 73 (or the topmost layer of the exemplary structure in case the dielectric pillar material layer 73 is not employed). Thus, at least a portion of each sacrificial material layer 42 can be replaced with an electrically conductive layer 45, which is a conductive material portion and can be a conductive line structure.

The electrically conductive layers 45 include lower level electrically conductive layers 44, which are formed within the volumes of the backside recesses 43 that are formed by removal of the lower level sacrificial material layers 42L. The number of the lower level electrically conductive layers 44 can be the same as the number n1 of the lower level sacrificial material layers 42L in the alternating stack (32, 42) at the processing step of FIG. 8. The lower level electrically conductive layers 44 include a bottommost lower level electrically conductive layer 44B, a topmost lower level electrically conductive layer 44T, and optionally at least one intermediate lower level electrically conductive layer 44M if the total number of lower level electrically conductive layer 44 is greater than 2.

The electrically conductive layers 45 further include upper level electrically conductive layers 48, which are formed within the volumes of the backside recesses 43 that are formed by removal of the upper level sacrificial material layers 42U. The number of the upper level electrically conductive layers 48 can be the same as the number n2 of the upper level sacrificial material layers 42U in the alternating stack (32, 42) at the processing step of FIG. 8. The upper level electrically conductive layers 48 include a bottommost upper level electrically conductive layer 48B, a topmost upper level electrically conductive layer 48T, and optionally at least one intermediate upper level electrically conductive layer 48M if the total number of upper level electrically conductive layer 48 is greater than 2.

The electrically conductive layers 45 further include control gate level electrically conductive layers 46, which are formed within the volumes of the backside recesses 43 that are formed by removal of the control gate level sacrificial material layers 42C. The number of the control gate level electrically conductive layers 46 can be the same as the number of the control gate level sacrificial material layers 42C in the alternating stack (32, 42) at the processing step of FIG. 8. The total number of the control gate level electrically conductive layers 46 can be at least the same as the number of levels of control gate electrodes employed in the three-dimensional memory device including the memory stack structures 55. Each control gate level electrically conductive layer 46 can be a conductive line including control gate electrodes for the three-dimensional memory device.

Figure 11:
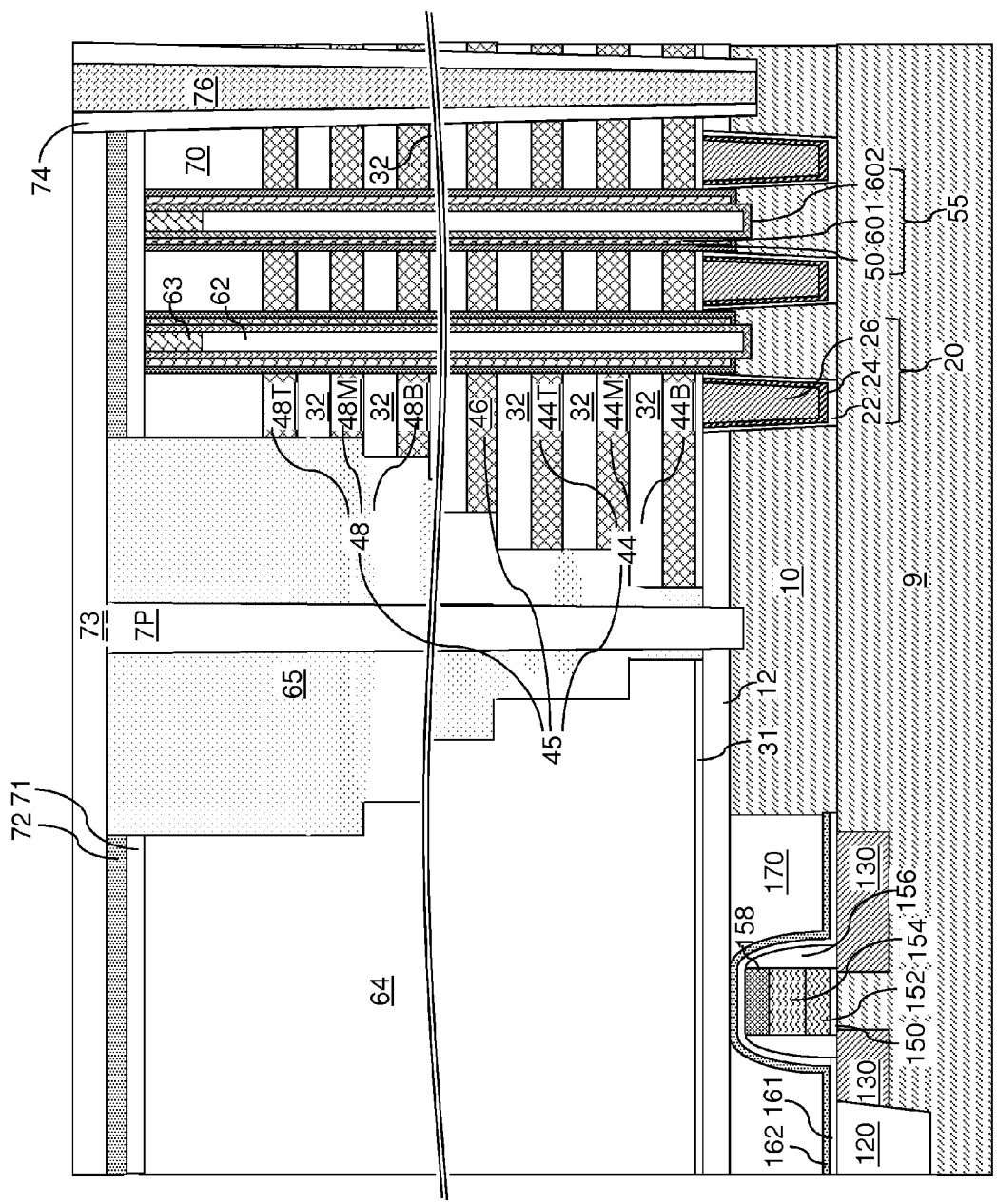
FIG. 11 is a vertical cross-sectional view of the first exemplary structure after formation of a backside contact spacer and a backside contact via structure according to the first embodiment of the present disclosure.

Referring to FIG. 11, the deposited conductive material can be etched back from the sidewalls of each backside contact trench 79 and from above the dielectric pillar material layer 73 (or the topmost layer of the exemplary structure in case the dielectric pillar material layer 73 is not employed), for example, by an isotropic etch. Each electrically conductive layer 45, which is located outside the volume of the backside contact cavity, can remain in its respective level.

Each control gate level electrically conductive layer 46 can function as a combination of a plurality of control gate electrodes and a word line electrically connecting, i.e., electrically shorting, the plurality of control gate electrodes. The plurality of control gate electrodes within control gate level electrically conductive layer 46 can include control gate electrodes located at the same level for the vertical memory devices including the memory stack structures 55. In other words, each control gate level electrically conductive layer 46 can be a word line that functions as a common control gate electrode for the plurality of vertical memory devices.

Each lower level electrically conductive layer 44 can function as a combination of a plurality of source select gate electrodes and a source select line electrically connecting, i.e., electrically shorting, the plurality of source select gate electrodes. The plurality of source select gate electrodes within lower level electrically conductive layer 44 can include source select gate electrodes located at the same level for the vertical memory devices including the memory stack structures 55. In other words, each lower level electrically conductive layer 44 can be a source select line that functions as a common source select gate electrode for the plurality of vertical memory devices.

Each upper level electrically conductive layer 48 can function as a combination of a plurality of drain select gate electrodes and a drain select line electrically connecting, i.e., electrically shorting, the plurality of drain select gate electrodes. The plurality of drain select gate electrodes within upper level electrically conductive layer 48 can include drain select gate electrodes located at the same level for the vertical memory devices including the memory stack structures 55. In other words, each upper level electrically conductive layer 48 can be a drain select line that functions as a common drain select gate electrode for the plurality of vertical memory devices.

An insulating spacer 74 can be formed on the sidewalls of the backside contact trench 79 by deposition of a contiguous dielectric material layer and an anisotropic etch of its horizontal portions. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A conductive material can be deposited within the cavity surrounded by the insulating spacer to fill the cavity. The deposited conductive material can be removed from above the topmost layer of the exemplary structure (which can be, for example, the dielectric pillar material layer 73) by a planarization process, which can be, for example, a chemical mechanical planarization (CMP) process. The remaining portion of the conductive material below the topmost layer of the exemplary structure and within the insulating spacer 74 constitutes a backside contact via structure 76. The backside contact via structure 76 can be a source line that extends through a dielectric insulated trench, i.e., the backside contact trench 79 filled with the dielectric spacer 74 and the backside contact via structure 76, in the stack to electrically contact a source region (not shown) within the substrate (9, 10). The source region can be in contact with the horizontal portion of the semiconductor channel in an upper portion of the substrate semiconductor layer 10.

Figure 12A:
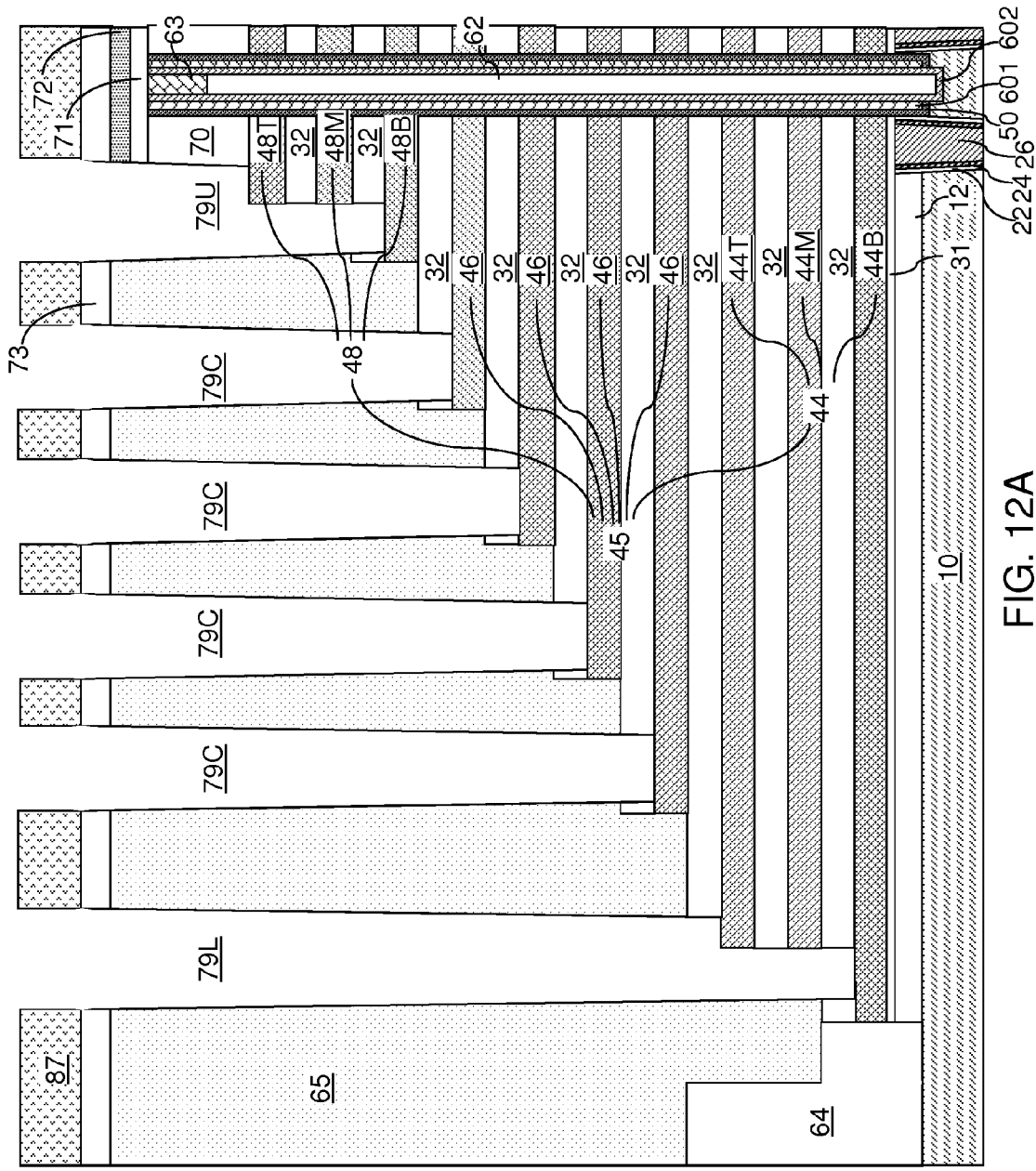
FIG. 12A is a vertical cross-sectional view of the first exemplary structure after formation of contact via cavities according to the first embodiment of the present disclosure.
Figure 12B:
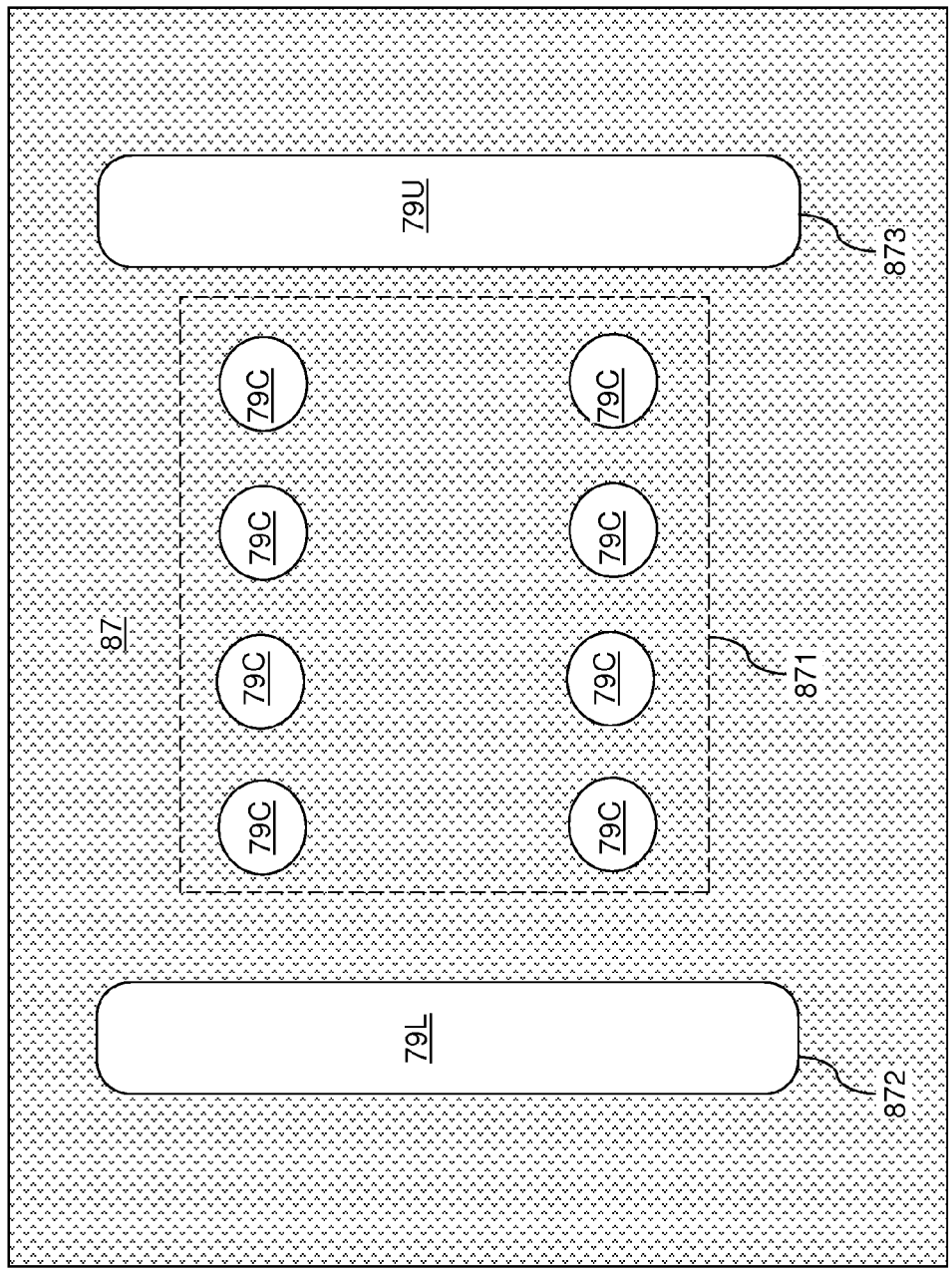
FIG. 12B is a top-down view of the first exemplary structure of FIG. 12A.

Prior to, concurrently with, or after, formation of the backside contact via structure 76 by deposition and planarization of a conductive material, contact via structures contacting the electrically conductive layers 45 can be formed. Referring to FIGS. 12A and 12B, a photoresist layer 87 can be applied over the topmost layer of the exemplary structure (which can be, for example, the dielectric pillar material layer 73), and can be lithographically patterned to form opening therein.

In one embodiment, the locations and sizes of the openings through the photoresist layer 87 can be selected such that a plurality of first-type openings 871 are formed so that each area of the opening is entirely within an area of a horizontal step of an insulator layer 32 contacting a top surface of a control gate level electrically conductive layers 46. In one embodiment, the shapes of the first-type openings 871 can be substantially circular or substantially elliptical. In one embodiment, the plurality of first-type openings 871 can be arranged as a linear array or an m×n two-dimensional rectangular array.

A second-type opening 872 can be formed in the photoresist layer 87 such that the area of the opening overlies a vertical sidewall of the topmost lower level electrically conductive layer 44T. The second-type opening 872 can be an elongated opening that has a greater lateral extent along the horizontal step direction of the stepped surfaces than a maximum lateral extent of any one of the first-type openings 871 along the horizontal direction of the stepped surfaces. The horizontal step direction of the stepped surfaces refers to a horizontal direction that provides a least horizontal distance between a pair of sidewalls (within a set of stepped surfaces) that adjoin a common horizontal step surface (which is selected from the set of stepped surfaces). In other words, the horizontal step direction of the stepped surfaces can be the horizontal direction along which the height of the stepped surfaces changes most rapidly with a horizontal distance. In one embodiment, the second-type opening 872 can be a rounded rectangular opening.

A third-type opening 873 can be formed in the photoresist layer 87 such that the area of the opening overlies a vertical sidewall of the topmost level electrically conductive layer 48T. The third-type opening 873 can be an elongated opening that has a greater lateral extent along the horizontal step direction of the stepped surfaces than a maximum lateral extent of any one of the first-type openings 871 along the horizontal direction of the stepped surfaces. In one embodiment, the third-type opening 873 can be a rounded rectangular opening.

The pattern in the photoresist layer 87 is transferred through the dielectric pillar material layer 73, the retro-stepped dielectric material portion 65, and a single insulator layer 32 by an anisotropic etch. Portions of the at least one dielectric cap layer (71, 72) and the insulating cap layer 70 can be etched underneath the third-type opening 873 in the photoresist layer 87. Control gate contact via cavities 79C are formed underneath the first-type openings 871 in the photoresist layer 87 by the anisotropic etch. Each control gate contact via cavity 79C can have a bottom surface consisting of a top surface of a control gate level electrically conductive layer 46, and can include a set of sidewalls that includes a sidewall of an insulator layer 32 overlying the control gate level electrically conductive layer 46 and a sidewall of the retro-stepped dielectric material portion 65.

A lower level contact via cavity 79L can be formed underneath the second-type opening 872 in the photoresist layer 87. In one embodiment, the chemistry of the anisotropic etch can be selected such that the anisotropic etch does not etch the conductive material of the lower level electrically conductive layers 44. In this case, the profile of the lower level contact via cavity 79L can include stepped surfaces that include a horizontal top surface of the bottommost lower level electrically conductive layer 44B, sidewalls of the topmost lower level electrically conductive layer 44T, each sidewall of at least one intervening lower level electrically conductive layer 44M, if any, each sidewall of at least one insulating layer 32 located between the topmost lower level electrically conductive layer 44T and the bottommost lower level electrically conductive layer 44B, and a horizontal surface of the topmost lower level electrically conductive layer 44T. Alternatively, the chemistry of the anisotropic etch can be selected so that the anisotropic etch removes the conductor material of the topmost lower level electrically conductive layer 44T and the at least one intervening lower level electrically conductive layer 44M, if any, and stops on the top surface of, or within, or below, the bottommost lower level electrically conductive layer 44B.

An upper level contact via cavity 79U can be formed underneath the third-type opening 873 in the photoresist layer 87. In one embodiment, the chemistry of the anisotropic etch can be selected such that the anisotropic etch does not etch the conductive material of the upper level electrically conductive layers 48. In this case, the profile of the upper level contact via cavity 79U can include stepped surfaces that include a horizontal top surface of the bottommost upper level electrically conductive layer 48B, sidewalls of the topmost upper level electrically conductive layer 48T, each sidewall of at least one intervening upper level electrically conductive layer 48M, if any, each sidewall of at least one insulating layer 32 located between the topmost upper level electrically conductive layer 48T and the bottommost upper level electrically conductive layer 48B, and optionally a horizontal surface of the topmost upper level electrically conductive layer 48T.

The backside contact via structure 76 can be a source line that extends through a dielectric insulated trench, i.e., the backside contact trench 79 filled with the dielectric spacer 74 and the backside contact via structure 76, in the stack to electrically contact the source region (not shown). The source region can be in contact with the horizontal portion of the semiconductor channel in an upper portion of the semiconductor material layer 10. An array of drain regions 63 contacts a respective semiconductor channel (601, 602) within the array of memory stack structures 55. A top surface of the dielectric material layer, i.e., the insulator cap layer 70, can be coplanar with top surfaces of the drain regions 63. A drain line, as embodied as a conductive line structure that contacts a drain contact via structure, can electrically contact an upper portion of the semiconductor channel (601, 602). As used herein, a first element "electrically contacts" a second element if the first element is electrically shorted to the second element.

Figure 13:
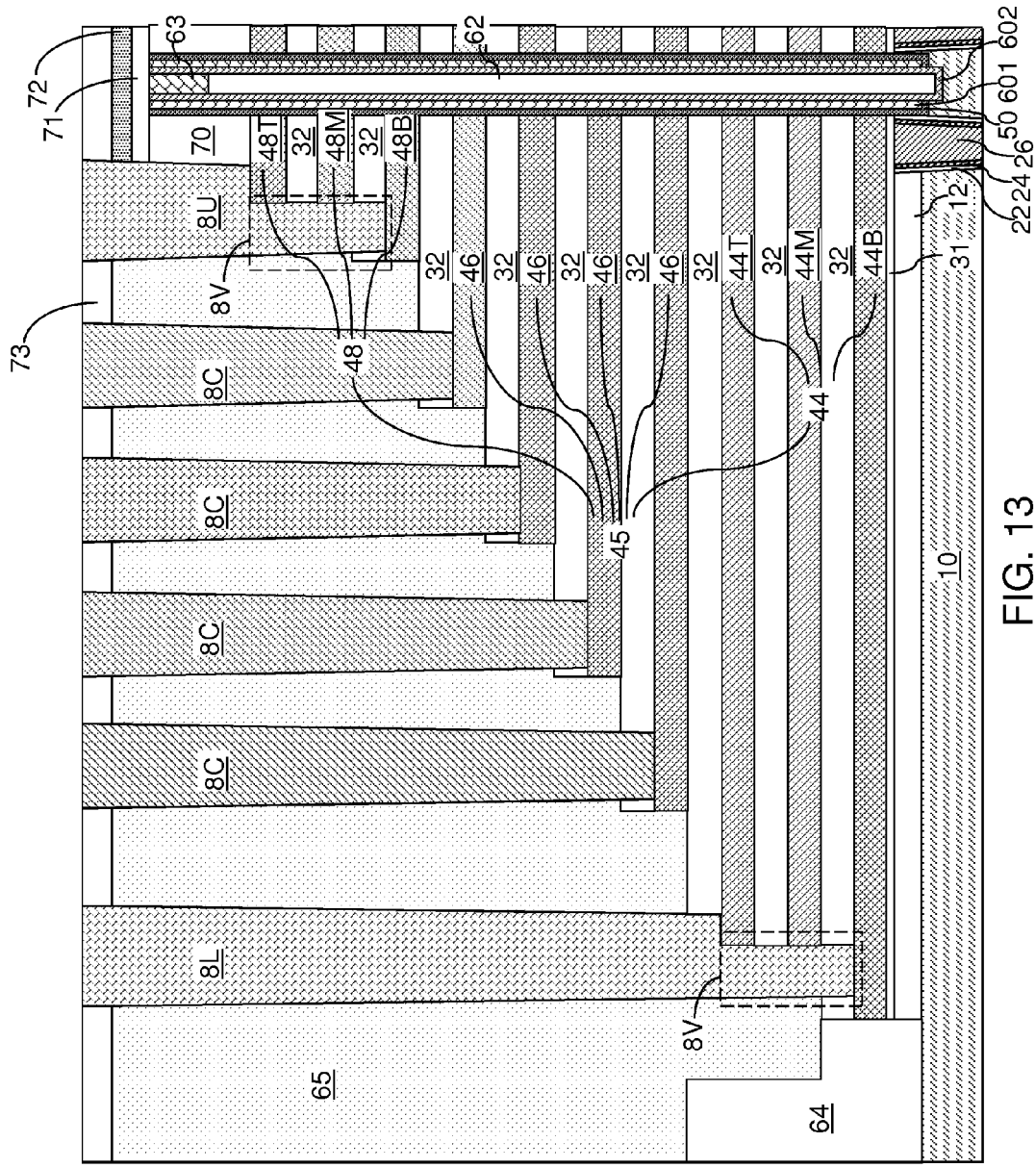
FIG. 13 is a vertical cross-sectional view of the first exemplary structure after formation of contact via structures according to the first embodiment of the present disclosure.

Referring to FIG. 13, a conductive material can be deposited in the control gate level contact via cavities 79C, the lower level contact via cavity 79L, and the upper level contact via cavity 79U, for example, by chemical vapor deposition, physical vapor deposition, electroplating, electroless plating, or a combination thereof. Deposition of the conductive material in the various contact via cavities (79C, 79L, 79U) can be performed in a separate processing step, or in conjunction with deposition of the conductive material in other types of contact via cavities such as the backside contact cavity and/or contact via cavities (not shown) for peripheral devices. Control gate contact via structures 8C can be formed in the control gate contact via cavities 79C, a lower level contact via structure 8L can be formed in the lower level contact via cavity 79L, and an upper level contact via structure 8U can be formed in the upper level contact via cavity 79U. Each of the lower level contact via structure 8L and the upper level contact via structure 8U includes a vertically extending conductive material portion 8V, which is a portion of the lower level contact via structure 8L located underneath a horizontal plane including the top surface of the topmost lower level electrically conductive layer 44T, or is a portion of the upper level contact via structure 8U located underneath a horizontal plane including the top surface of the topmost upper level electrically conductive layer 48T.

The first exemplary structure includes a multilevel structure, which comprises a stack (32, 45) of an alternating plurality of electrically conductive layers 45 and insulator layers 32 located over a substrate (9, 10), a plurality of contact via structures (such as the control gate contact via structures 8C, the lower level contact via structure 8L, and the upper level contact via structure 8U) having bottom surfaces contacting a respective electrically conductive layer (such as the control gate level electrically conductive layer 46, the topmost and bottommost lower level electrically conductive layers (44T, 44B), and the topmost and bottommost upper level electrically conductive layers (48T, 48B)) located at different levels. The multilevel structure further comprises a vertically extending conductive material portion 8V contacting at least two electrically conductive layers (which can be the lower level electrically conductive layers 44 or the upper level electrically conductive layers 48), and contacting each sidewall of at least one intervening insulator layer 32 that is located between a topmost electrically conductive layer among the at least two electrically conductive layers (which is either the topmost lower level electrically conductive layer 44T or the topmost upper level electrically conductive layer 48T) and a bottommost electrically conductive layer among the at least two electrically conductive layers (which is either the bottommost lower level electrically conductive layer 44B or the bottommost upper level electrically conductive layer 48B).

In one embodiment, the at least one intervening insulator layer 32 can comprise a plurality of intervening insulator layers 32 having sidewalls that are vertically coincident among one another. In one embodiment, the vertically extending conductive material portion 8V can be a portion within one of the plurality of contact via structures, i.e., a portion of the lower level contact via structure 8L or a portion of the upper level contact via structure 8U. In one embodiment, the vertically extending conductive material portion 8V contacts a top surface of the bottommost electrically conductive layer (44B or 48B) among the at least two electrically conductive layers (44 or 48). Each vertically extending conductive material portion 8V contacts sidewalls of the at least two electrically conductive layers (44 or 48), and may optionally contact a top surface of a bottommost electrically conductive layer among the at least two electrically conductive layers (44 or 48).

At least one insulator layer 32 is located between the topmost electrically conductive layer (44T or 48T) among the at least two electrically conductive layers (44 or 48) and the bottommost electrically conductive layer (44B or 48B) among the at least two electrically conductive layers (44 or 48), and has a sidewall surface that is vertically coincident with a sidewall of the topmost electrically conductive layer (44T or 48T) among the at least two electrically conductive layers (44 or 48). In one embodiment, the at least two electrically conductive layers (44 or 48) can comprise at least three electrically conductive layers, and the sidewall of the at least one insulator layer 32 can be vertically coincident with a sidewall of an electrically conductive layer (44M or 48M) that is located between the topmost and bottommost electrically conductive layers {(44T, 44B) or (48T, 48B)} among the at least three electrically conducting layers.

A subset 46 of the electrically conductive layers 45 comprises control gate electrodes for the at least one memory stack structure 55. The at least two electrically conductive layers (44 or 48) can comprise select gate electrodes located above, or underneath, the control gate electrodes. Specifically, the lower level electrically conductive layers 44 can comprise lower level select gate electrodes located below the control gate electrodes. The lower level electrically conductive layers 44 can comprise source select gate electrodes, which can be employed to select a semiconductor channel (601, 602) to be activated from the source side. The upper level electrically conductive layers 48 can comprise upper level select gate electrodes located above the control gate electrodes. The upper level electrically conductive layers 48 can comprise drain select gate electrodes, which can be employed to select a semiconductor channel (601, 602) to be activated from the drain side.

Each control gate contact via structure 8C contacts, and vertically extends above, a respective electrically conductive layer, i.e., a control gate electrically conductive layer 46, within the subset of electrically conductive layers 45. Each select gate contact via structure (8L or 8U) contacts the at least two electrically conductive layers (44 or 48) and has a greater lateral extent along the horizontal step direction than a maximum lateral extent of any of the control gate contact via structures 8C along the horizontal direction. The horizontal step direction provides a least horizontal distance between a pair of sidewalls (within a set of stepped surfaces) that adjoin a common horizontal step surface (which is selected from the set of stepped surfaces).

In one embodiment, the device located over the semiconductor substrate can include a vertical NAND device located in the device region, and at least one of the electrically conductive layers 46 in the stack (32, 45) can comprise, or can be electrically connected to, a word line of the NAND device. The device region can include a plurality of semiconductor channels (601, 602). At least one end portion of each of the plurality of semiconductor channels (601, 602) extends substantially perpendicular to a top surface of the semiconductor substrate. The device region further includes a plurality of charge storage regions located within each memory layer 50. Each charge storage region is located adjacent to a respective one of the plurality of semiconductor channels (601, 602). The device region further includes a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The plurality of electrically conductive layers 46 in the stack (32, 45) can be in electrical contact with, or can comprise, the plurality of control gate electrodes, and extends from the device region to a contact region including a plurality of electrically conductive contact via structures.

In case the exemplary structure includes a three-dimensional NAND device, a stack (32, 45) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 45). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 45).

In a non-limiting illustrative example, the insulating layers 32 can comprise silicon oxide layers, the plurality of word lines 46 can comprise tungsten or a combination of titanium nitride and tungsten, the memory film 50 can comprises a tunneling dielectric, a blocking dielectric layer, and either a plurality of floating gates or a charge trapping layer located between the tunneling dielectric layer and the blocking dielectric layer. An end portion of each of the plurality of word lines 46 in a device region can comprise a control gate electrode located adjacent to the at least one charge storage region. A plurality of contact via structures contacting the word lines 46 can be located in a contact region. The plurality of word lines 46 extends from the device region to the contact region.

Figure 14:
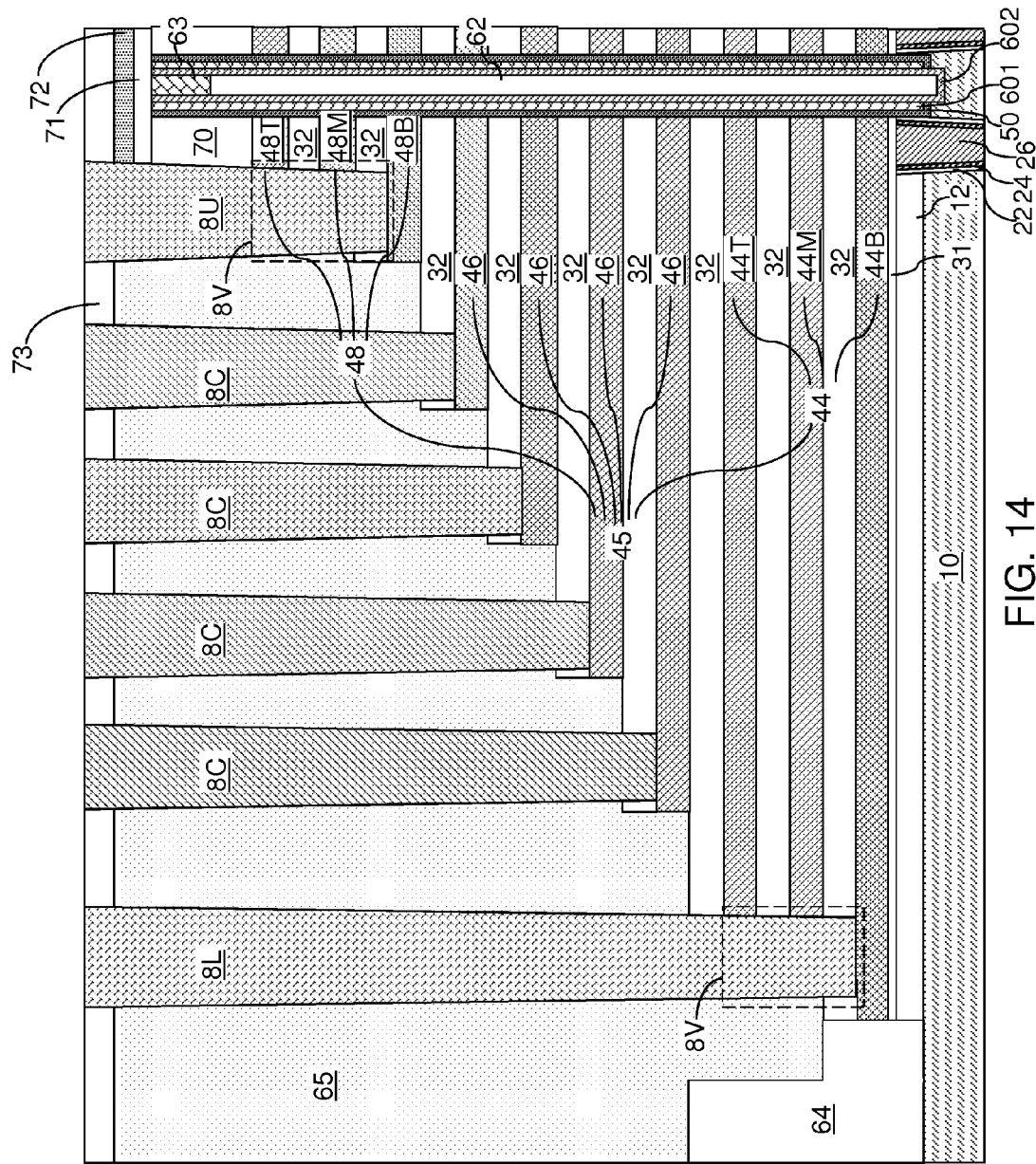
FIG. 14 is a vertical cross-sectional view of a first alternate embodiment of the first exemplary structure.

Referring to FIG. 14, a first alternative embodiment of the first exemplary structure is shown, which can be derived from the first exemplary structure by modifying the terminal portion of the anisotropic etch process employed at a processing step of FIGS. 12A and 12B to be non-selective between the material of the insulator layers 32 and the material of the electrically conductive layers 45. In this case, the lower level contact via structure 8L and the upper level contact via structure 8U do not include stepped surfaces at a respective bottom portion.

Figure 15:
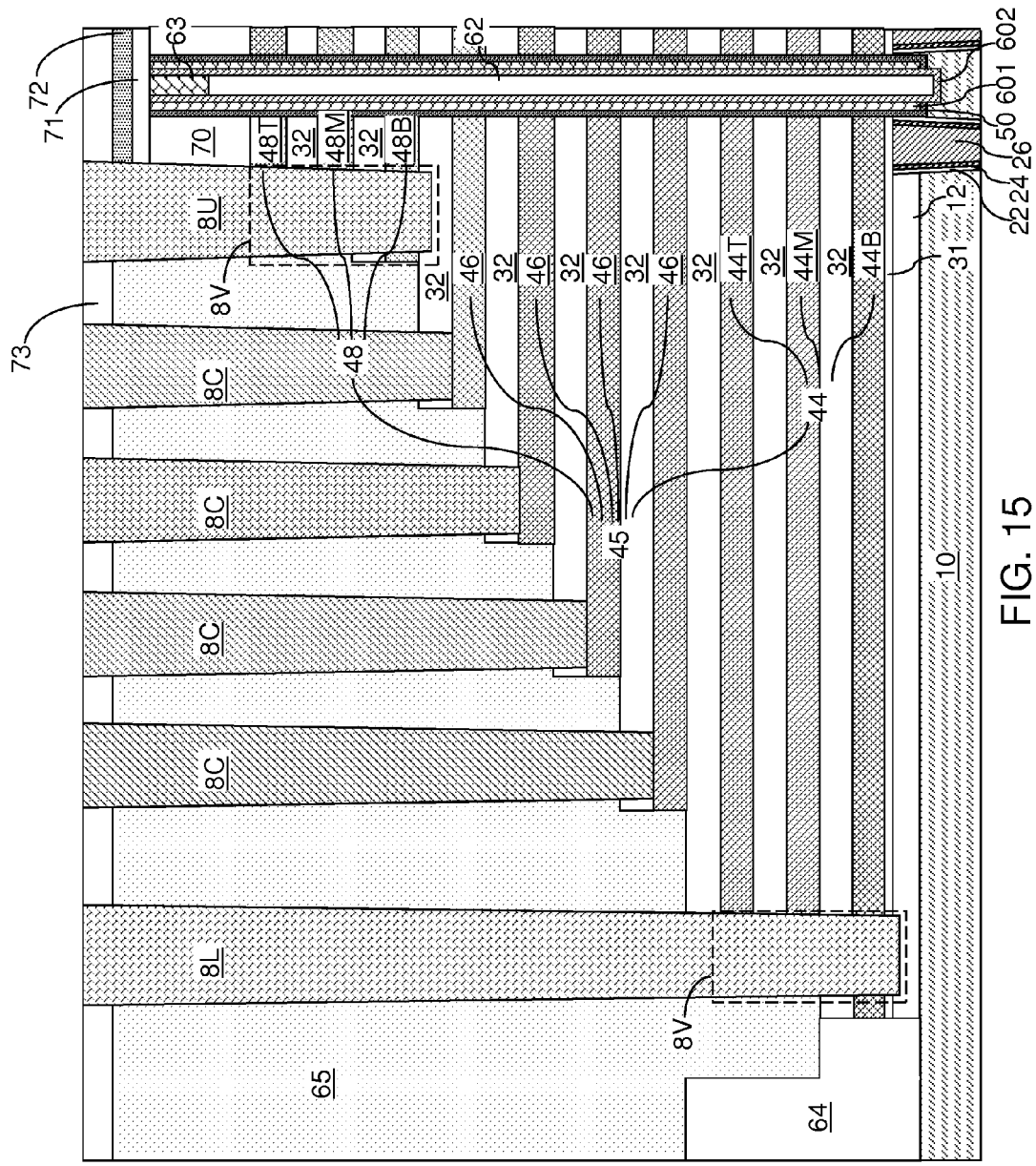
FIG. 15 is a vertical cross-sectional view of a second alternate embodiment of the first exemplary structure.

Referring to FIG. 15, a second alternative embodiment of the first exemplary structure is shown, which can be derived from the first exemplary structure by modifying the terminal portion of the anisotropic etch process employed at a processing step of FIGS. 12A and 12B to be non-selective between the material of the insulator layers 32 and the material of the electrically conductive layers 45 and/or by extending the anisotropic etch to etch through the bottommost upper level electrically conductive layer 48B or the bottommost lower level electrically conductive layer 44B. In this case, the lower level contact via structure 8L and the upper level contact via structure 8U do not include stepped surfaces at a respective bottom portion. Further, the vertically extending conductive material portion 8V can contact a sidewall of each electrically conductive layer (44 or 48) within the at least two electrically conductive layers (44 or 48).

Figure 16:
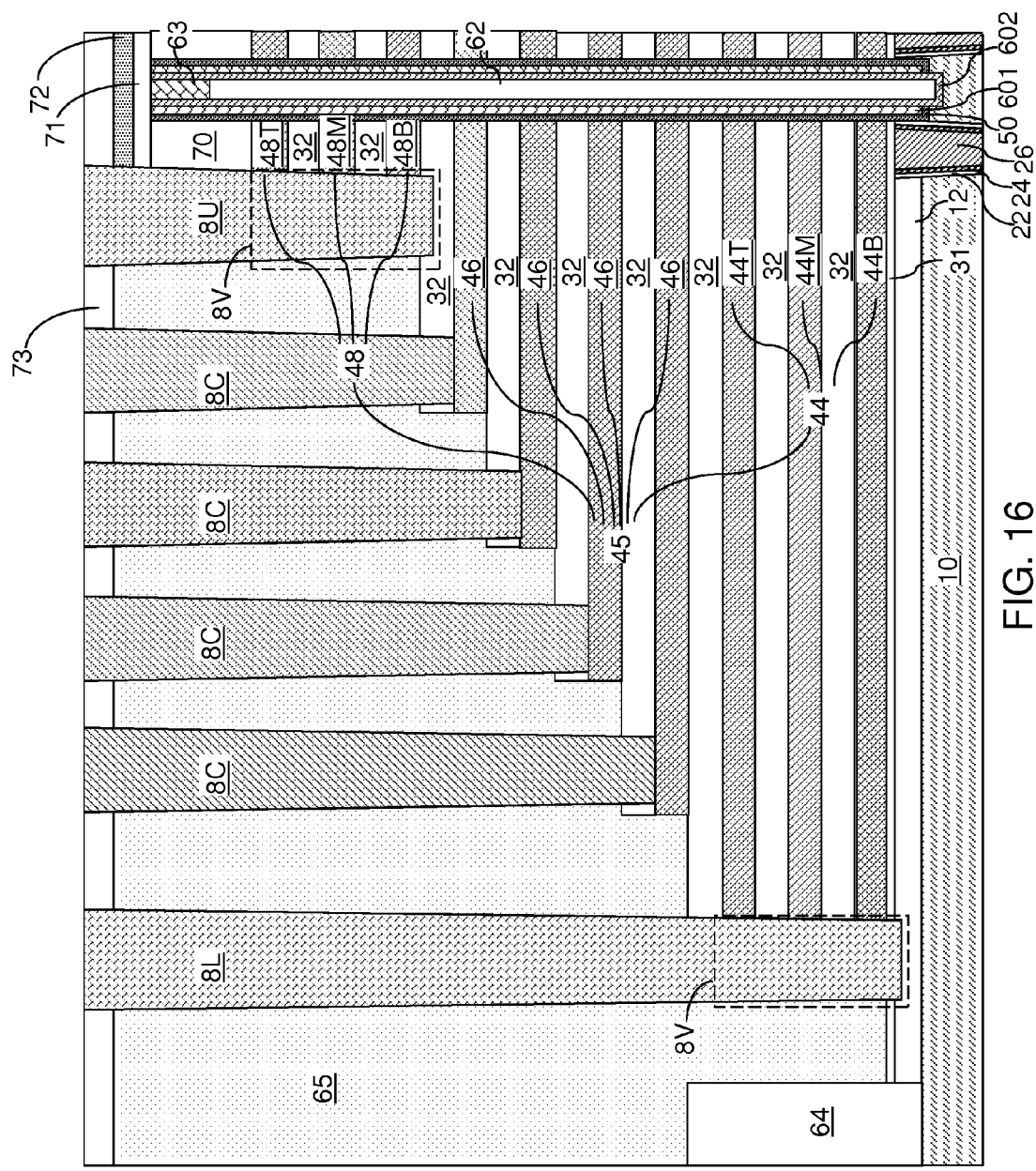
FIG. 16 is a vertical cross-sectional view of a third alternate embodiment of the first exemplary structure.

Referring to FIG. 16, a third alternative embodiment of the first exemplary structure is shown, which can be formed by forming the stepped trench 69 such that all (e.g., n1) of the lower level sacrificial material layers 42L have vertically coincident sidewalls, and all (e.g., n2) of the upper level sacrificial material layers 42U have vertically coincident sidewalls. The vertically extending conductive material portion 8V of each select gate contact via structure (8L or 8U) contacts sidewalls of the at least two electrically conductive layers (44 or 48), and does not contact any top surface of electrically conductive layers 45. The vertically extending conductive material portion 8V of each select gate contact via structure (8L or 8U) contacts each sidewall of at least one insulator layer 32 located between a topmost layer among the at least two electrically conductive layers (44 or 48) and a bottommost layer among the at least two electrically conductive layers (44 or 48).

Figure 17:
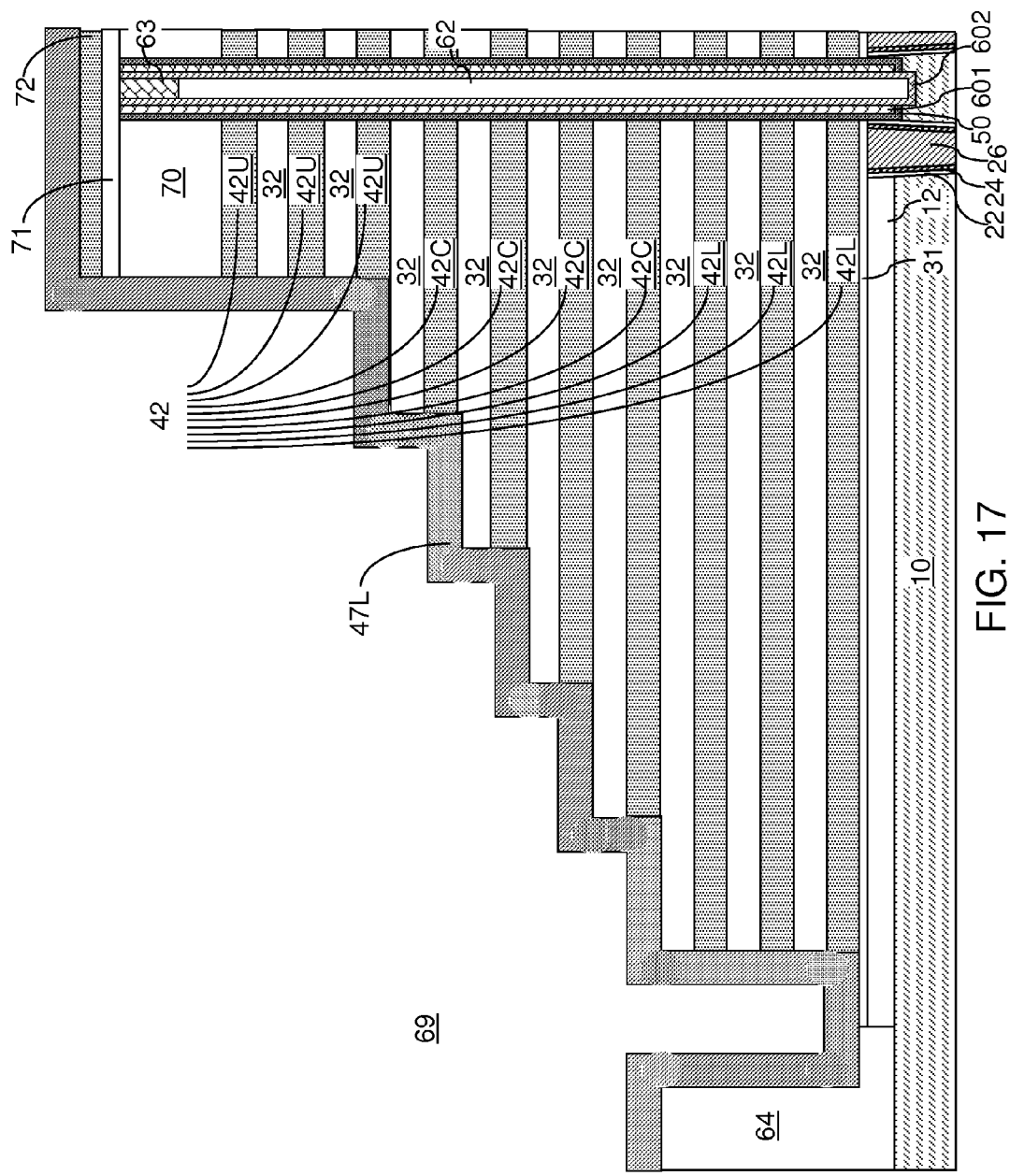
FIG. 17 is a vertical cross-sectional view of a second exemplary structure after formation of a set of stepped surfaces including multi-level steps and a contiguous dielectric material layer according to a second embodiment of the present disclosure.

Referring to FIG. 17, a second exemplary structure according to a second embodiment of the present disclosure can be derived from the first exemplary structure illustrated in FIG. 7 by depositing a contiguous sacrificial material layer 47L within the stepped trench 69. At least two sacrificial material layers 42 within the stack have sidewalls that are vertically coincident among one another. The contiguous sacrificial material layer 47L can contact a first set of vertically coincident sidewalls that include at least two sidewalls of the lower level sacrificial material layers 42L and at least two sidewalls of insulator layers 32, and a second set of vertically coincident sidewalls that include at least two sidewalls of the upper level sacrificial material layers 42U and each sidewall of at least one insulator layer 32. The contiguous sacrificial material layer 47L contacts each horizontal surface and each sidewall of the set of stepped surfaces.

The contiguous sacrificial material layer 47L includes a sacrificial material that can be removed selective to the material of the insulator layers 32. The sacrificial material can be, for example, a semiconductor material such as polysilicon or amorphous silicon, or a dielectric material such as silicon nitride. In one embodiment, the sacrificial material can be the same as the material of the sacrificial material layers 42. In one embodiment, the contiguous sacrificial material layer 47L can be deposited by a conformal deposition method such as low pressure chemical vapor deposition. The thickness of the contiguous sacrificial material layer 47L, as measured on vertical portions thereof, can be in a range from 3 nm to 60 nm, although lesser and greater thicknesses can also be employed.

Figure 18:
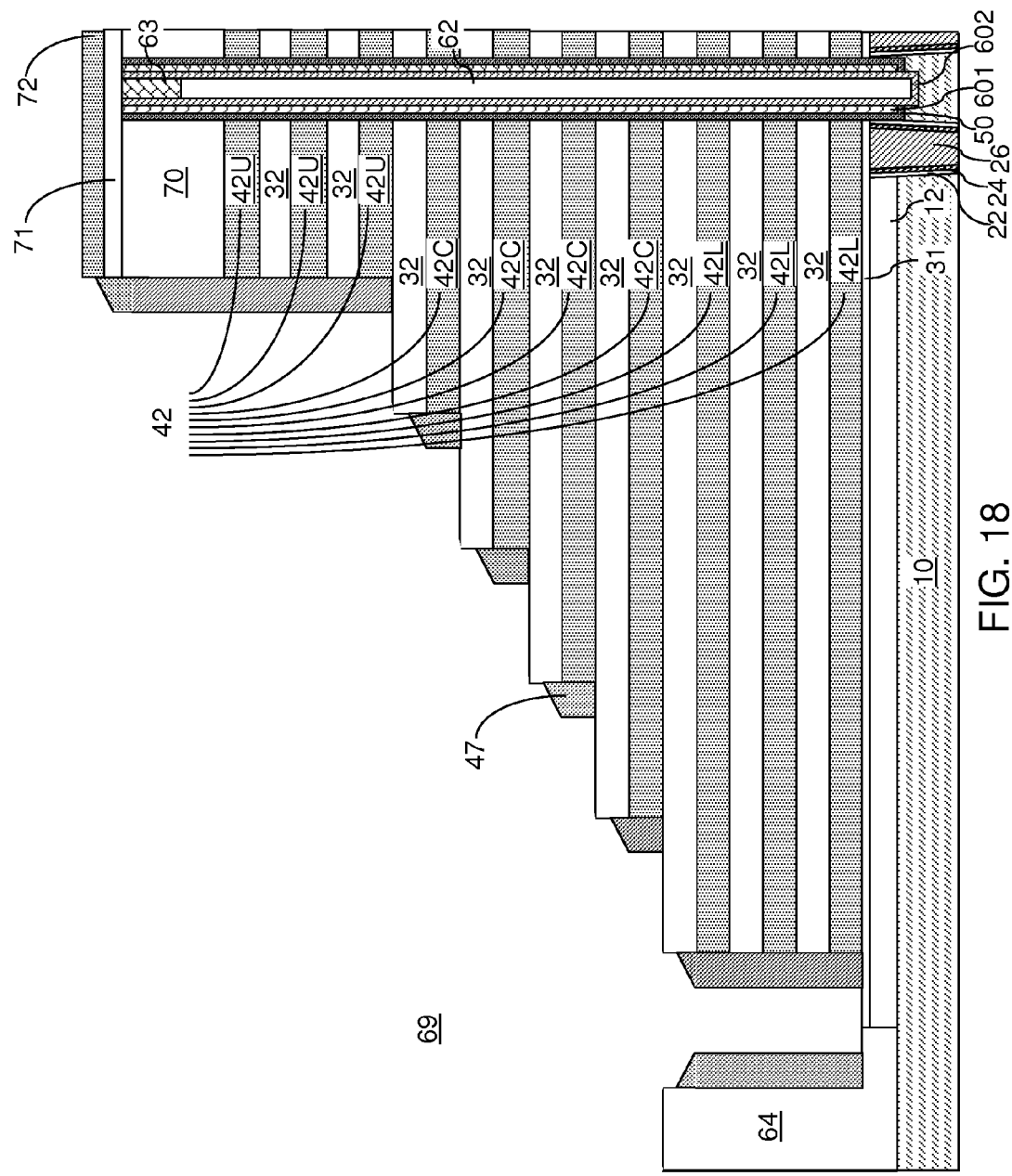
FIG. 18 is a vertical cross-sectional view of the second exemplary structure after formation of spacers according to the second embodiment of the present disclosure.

Referring to FIG. 18, an anisotropic etch can be performed to remove horizontal portions of the contiguous sacrificial material layer 47L. Each remaining vertical portion of the contiguous sacrificial material layer 47L constitutes a spacer 47. Spacers 47 formed on a sidewall of a control gate level sacrificial material layer 42C can contact a sidewall of an insulator layer 32 that contacts the top surface of the control gate level sacrificial material layer 42C. A spacer 47 formed on sidewalls of lower level electrically conductive layers 42L can contact each sidewall of at least one intervening insulator layer 32 located between the topmost layer and the bottommost layer among the lower level sacrificial material layers 42L. A spacer 47 formed on sidewalls of upper level electrically conductive layers 42U can contact each sidewall of at least one intervening insulator layer 32 located between the topmost layer and the bottommost layer among the upper level sacrificial material layers 42U. Spacers 47 formed on the sidewalls of the sacrificial material layers 42 are subsequently replaced with a conductive material, and therefore, are sacrificial spacers. Further, additional spacers 47 can contact each sidewall of the stepped surfaces of the dielectric material portion 64. The spacers that are formed directly on the sidewalls of the dielectric material portion 64 may not be subsequently replaced with a conductive material, and therefore, may not be sacrificial spacers, i.e., may be permanent spacers that are not replaced with another element. In one embodiment, each spacer 47 (i.e., each of sacrificial and non-sacrificial spacers collectively) can have a tapered surface, i.e., a non-horizontal non-vertical surface, at a top portion thereof.

Figure 19:
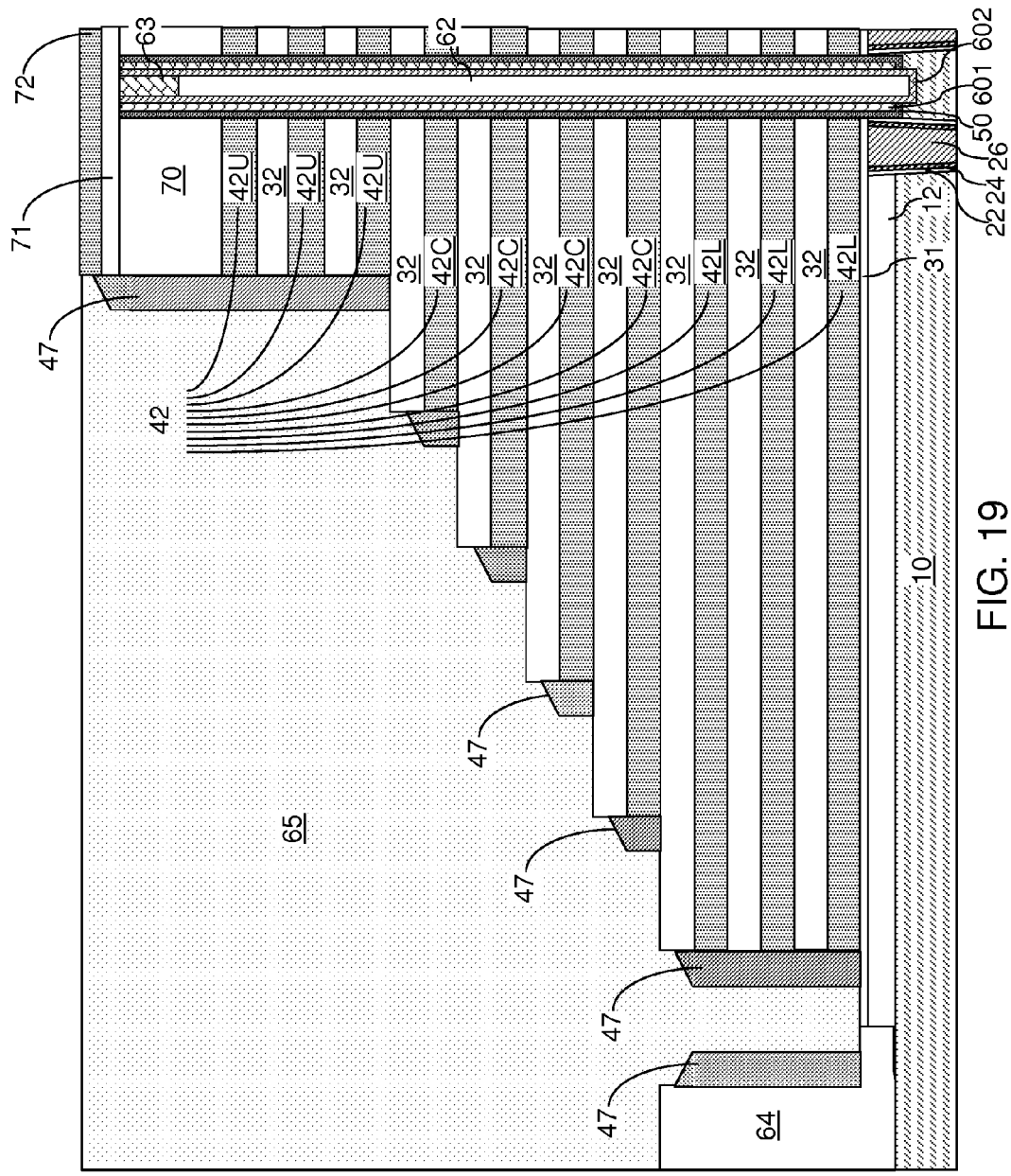
FIG. 19 is a vertical cross-sectional view of the second exemplary structure after formation of a retro-stepped dielectric material portion according to the second embodiment of the present disclosure.

Referring to FIG. 19, the processing steps of FIG. 8 can be performed to form a retro-stepped dielectric material portion 65. The retro-stepped dielectric material portion 65 has a different composition that the spacers 47. In one embodiment, the retro-stepped dielectric material portion 65 can include, for example, silicon oxide and/or organosilicate glass (OSG).

Figure 20:
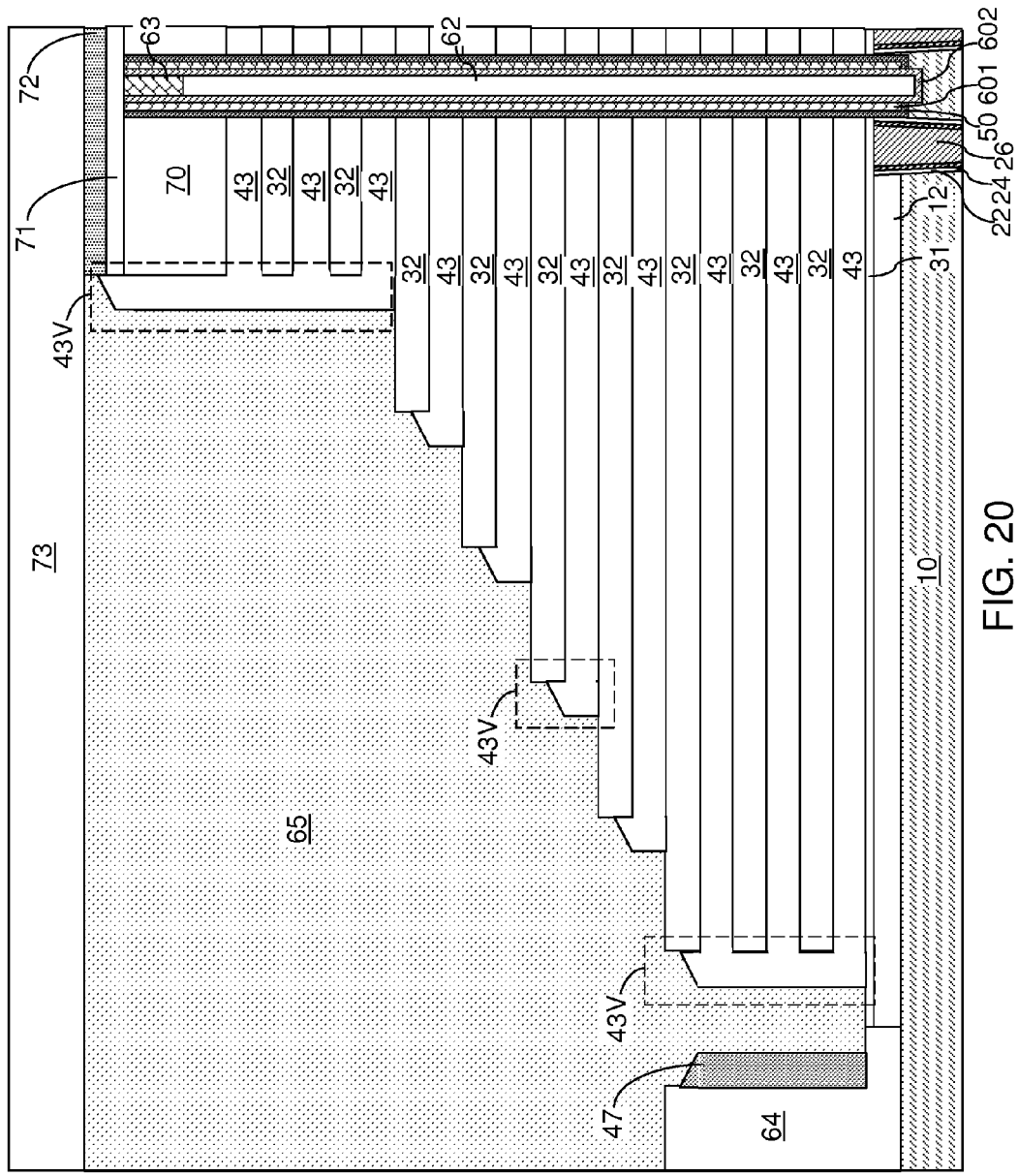
FIG. 20 is a vertical cross-sectional view of the second exemplary structure after formation of backside cavities and vertically extending cavities according to the second embodiment of the present disclosure.

Referring to FIG. 20, the processing steps of FIG. 9 can be subsequently performed. At least one dielectric support pillar (not shown) may be optionally formed through the retro-stepped dielectric material portion 65 and/or through the alternating stack (32, 42). In one embodiment, the at least one dielectric support pillar can include silicon oxide and/or a dielectric metal oxide such as aluminum oxide. In one embodiment, the portion of the dielectric material that is deposited over the at least one dielectric cap layer (71, 72) concurrently with deposition of the at least one dielectric support pillar can be present over the at least one dielectric cap layer (71, 72) as a dielectric pillar material layer 73.

A photoresist layer (not shown) can be applied over the alternating stack (32, 42) and/or the retro-stepped dielectric material portion 65, and lithographically patterned to form at least one backside contact trench in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench, which extends at least to the top surface of the substrate (9, 10).

An etchant that selectively etches the second material of the sacrificial material layers 42 with respect to the first material of the insulator layers 32 can be introduced into the at least one backside contact trench, for example, employing an etch process. Backside recesses 43 are formed in volumes from which the sacrificial material layers 42 are removed. The removal of the second material of the sacrificial material layers 42 can be selective to the first material of the insulator layers 32, the material of the at least one dielectric support pillar, the material of the retro-stepped dielectric material portion 65, the semiconductor material of the substrate semiconductor layer 10, and the material of the outermost layer of the memory films 50.

The spacers 47 formed on the sacrificial material layers 42 can be subsequently removed. If the spacers 47 include the same material as the sacrificial material layers 42, the same etchant can be employed to remove the spacers 47 as the sacrificial material layers 42. If the spacers 47 include a material that is different from the material of the sacrificial material layers, another selective etch process can be performed, which removes the material of the sacrificial spacers selective to the first material of the insulator layers 32, the material of the at least one dielectric support pillar, the material of the retro-stepped dielectric material portion 65, the semiconductor material of the substrate semiconductor layer 10, and the material of the outermost layer of the memory films 50.

In one embodiment, the sacrificial material layers 42 and/or the spacers 47 can include silicon nitride, and the materials of the insulator layers 32, the at least one dielectric support pillar, and the retro-stepped dielectric material portion 65 can be selected from silicon oxide and dielectric metal oxides. In another embodiment, the sacrificial material layers 42 and/or the spacers 47 can include a semiconductor material such as germanium or a silicon-germanium alloy, and the materials of the insulator layers 32, the at least one dielectric support pillar 7P, and the retro-stepped dielectric material portion 65 can be selected from silicon oxide, silicon nitride, and dielectric metal oxides.

The etch process that removes the second material and/or the material of the spacers 47 selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 and/or the spacers 47 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region comprises an array of monolithic three dimensional NAND strings having a plurality of device levels disposed above the substrate (9, 10). In this case, each backside recess 43 can define a space for receiving a respective word line of the array of monolithic three dimensional NAND strings.

Each of the plurality of backside recesses 43 can extend substantially parallel to the top surface of the substrate (9, 10). A backside recess 43 can be vertically bounded by a top surface of an underlying insulator layer 32 and a bottom surface of an overlying insulator layer 32. In one embodiment, each backside recess 43 can have a uniform height throughout.

A vertically extending cavity 43V is formed in each volume from which a spacer 47 is removed. The bottommost vertically extending cavity 43V is directly connected to each backside recess 43 formed by removal of lower level sacrificial material layers 42L. A set including the bottommost vertically extending cavity 43V and the backside recesses 43 directly connected thereto collectively constitutes a first contiguous multilevel cavity. The topmost vertically extending cavity 43V is directly connected to each backside recess 43 formed by removal of upper level sacrificial material layers 42U. A set including the topmost vertically extending cavity 43V and the backside recesses 43 directly connected thereto collectively constitutes a second contiguous multilevel cavity.

Figure 21:
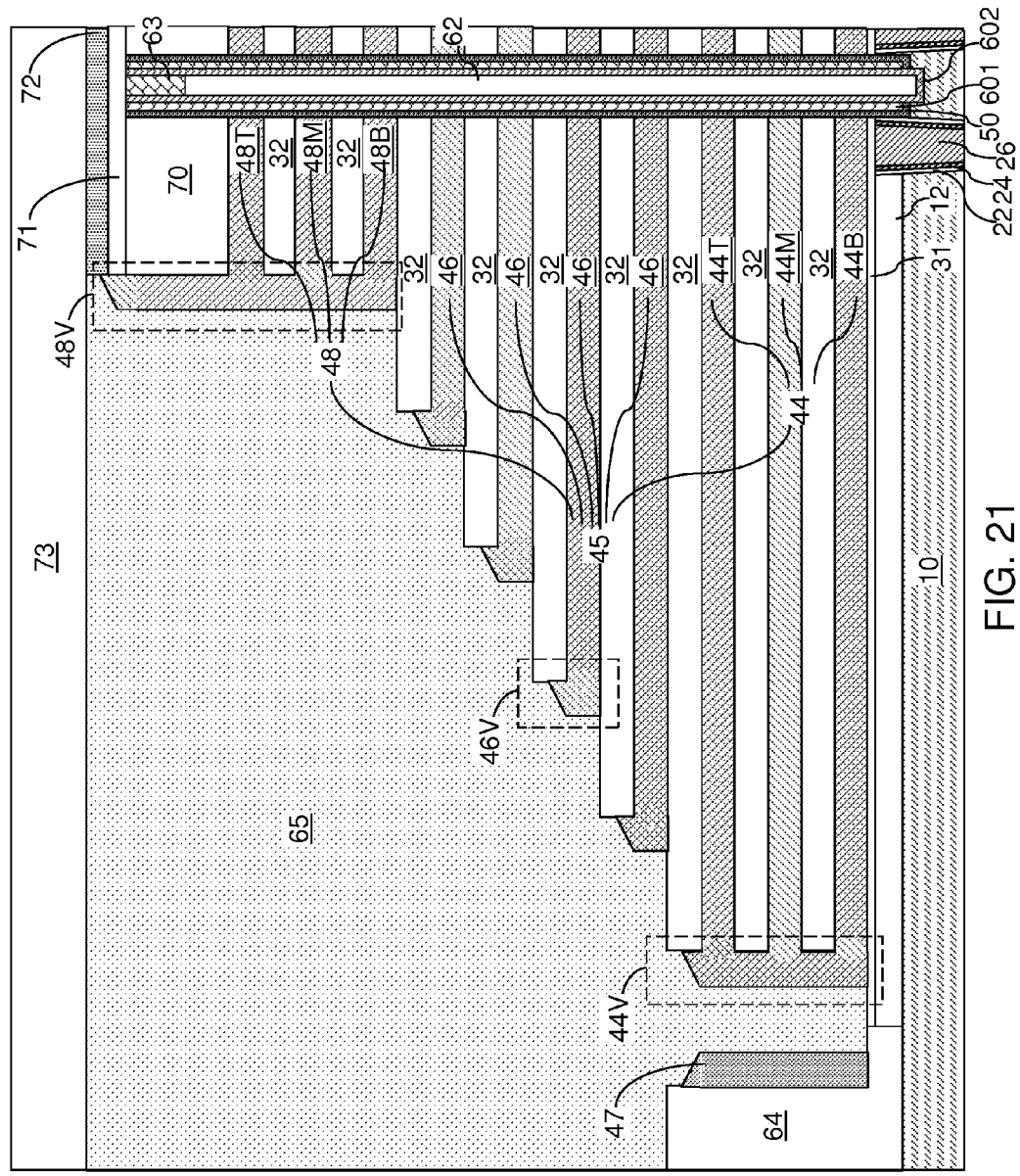
FIG. 21 is a vertical cross-sectional view of the second exemplary structure after formation of electrically conductive layers according to the second embodiment of the present disclosure.

Referring to FIG. 21, the processing steps of FIGS. 10 and 11 can be subsequently performed to form various electrically conductive layers 45. The materials of the sacrificial material layers 42 and the spacers 47 are replaced with a conductive material. An electrically conductive layer 45 is formed in each volume of a sacrificial material layer 42, and a conductive material spacer (44V, 46V, 48V) is formed in each volume of a spacer 47, which is the same as the volume of a respective vertically extending cavity 43V.

A plurality of electrically conductive layers 45 can be formed in the volumes of the plurality of backside recesses 43. The electrically conductive layers 45 include lower level electrically conductive layers 44, which are formed within the volumes of the backside recesses 43 that are formed by removal of the lower level sacrificial material layers 42L. The number of the lower level electrically conductive layers 44 can be the same as the number n1 of the lower level sacrificial material layers 42L in the alternating stack (32, 42) at the processing step of FIG. 18. The lower level electrically conductive layers 44 include a bottommost lower level electrically conductive layer 44B, a topmost lower level electrically conductive layer 44T, and optionally at least one intermediate lower level electrically conductive layer 44M if the total number of lower level electrically conductive layer 44 is greater than 2.

The electrically conductive layers 45 further include upper level electrically conductive layers 48, which are formed within the volumes of the backside recesses 43 that are formed by removal of the upper level sacrificial material layers 42U. The number of the upper level electrically conductive layers 48 can be the same as the number n2 of the upper level sacrificial material layers 42U in the alternating stack (32, 42) at the processing step of FIG. 18. The upper level electrically conductive layers 48 include a bottommost upper level electrically conductive layer 48B, a topmost upper level electrically conductive layer 48T, and optionally at least one intermediate upper level electrically conductive layer 48M if the total number of upper level electrically conductive layer 48 is greater than 2.

The electrically conductive layers 45 further include control gate level electrically conductive layers 46, which are formed within the volumes of the backside recesses 43 that are formed by removal of the control gate level sacrificial material layers 42C. The number of the control gate level electrically conductive layers 46 can be the same as the number of the control gate level sacrificial material layers 42C in the alternating stack (32, 42) at the processing step of FIG. 18. The total number of the control gate level electrically conductive layers 46 can be at least the same as the number of levels of control gate electrodes employed in the three-dimensional memory device including the memory stack structures 55. Each control gate level electrically conductive layer 46 can be a conductive line including control gate electrodes for the three-dimensional memory device.

A conductive material spacer (44V, 46V, 48V) can be formed in each vertically extending cavity 43V concurrently with formation of the electrically conductive layers 45 in the backside recesses 43. A bottommost conductive material spacer 44V is a vertically extending conductive material portion contacting at least two electrically conductive layers (i.e., the lower level electrically conductive layers 44) and contacting each sidewall of at least one intervening insulator layer 32 that is located between a topmost electrically conductive layer among the at least two electrically conductive layers (i.e., the topmost lower level electrically conductive layer 44T) and a bottommost electrically conductive layer among the at least two electrically conductive layers (i.e., the bottommost lower level electrically conductive layer 44B). The bottommost conductive material spacer 44V contacts a sidewall of each lower level electrically conductive layer 44. A topmost conductive material spacer 48V is a vertically extending conductive material portion contacting at least two electrically conductive layers (i.e., the upper level electrically conductive layers 48) and contacting each sidewall of at least one intervening insulator layer 32 that is located between a topmost electrically conductive layer among the at least two electrically conductive layers (i.e., the topmost upper level electrically conductive layer 48T) and a topmost electrically conductive layer among the at least two electrically conductive layers (i.e., the topmost upper level electrically conductive layer 48B). The topmost conductive material spacer 48V contacts a sidewall of each upper level electrically conductive layer 48. Each of control gate level conductive material spacer 46V can be a vertically extending conductive material portion contacting a single control gate level electrically conductive layer 46.

The bottommost conductive material spacer 44V is of integral construction with the entirety of the at least two electrically conductive layers (i.e., the lower level electrically conductive layers 44). As used herein, a first element is of integral construction with a second element if the first element and the second element are adjoined to each other without any physically manifested or observable interface between the first element and the second element. The topmost conductive material spacer 48V is of integral construction with the entirety of the at least two electrically conductive layers (i.e., the upper level electrically conductive layers 48). Each of control gate level conductive material spacer 46V is of integral construction with a control gate level electrically conductive layer 46. The conductive material spacers (44V, 46V, 48V) and the electrically conductive layers 45 can comprise a same material composition, which is the composition of the conductive material that is concurrently deposited in the backside recesses 43 and the vertically extending cavities 43V.

The bottommost conductive material spacer 44V contacts each sidewall of at least one intervening insulator layer 32 located between the topmost lower level electrically conductive layer 44T and the bottommost lower level electrically conductive layer 44B. If the at least one intervening insulator layer 32 is a plurality of intervening insulator layers 32, the sidewalls of the plurality of intervening insulator layers 32 can be vertically coincident among one another, and contact a sidewall of the bottommost conductive material layer 44V. The topmost conductive material spacer 48V contacts each sidewall of at least one intervening insulator layer 32 located between the topmost upper level electrically conductive layer 48T and the topmost upper level electrically conductive layer 48B. If the at least one intervening insulator layer 32 is a plurality of intervening insulator layers 32, the sidewalls of the plurality of intervening insulator layers 32 can be vertically coincident among one another, and contact a sidewall of the topmost conductive material layer 48V.

The dielectric material portion 64 can include stepped surfaces, and as such, can be a stepped dielectric material portion. Spacers 47 located on the dielectric material portion 64 may a permanent spacer, and as such, may not be replaced with a conductive material. In this case, each of the spacers 47 on the dielectric material portion can have the same thickness as the conductive material spacers (44V, 46V, 48V), and can have a different composition from, the conductive material spacers (44V, 46V, 48V), which are vertically extending conductive material portions.

Each control gate level electrically conductive layer 46 can function as a combination of a plurality of control gate electrodes and a word line electrically connecting, i.e., electrically shorting, the plurality of control gate electrodes. The plurality of control gate electrodes within control gate level electrically conductive layer 46 can include control gate electrodes located at the same level for the vertical memory devices including the memory stack structures 55. In other words, each control gate level electrically conductive layer 46 can be a word line that functions as a common control gate electrode for the plurality of vertical memory devices.

Each lower level electrically conductive layer 44 can function as a combination of a plurality of source select gate electrodes and a source select line electrically connecting, i.e., electrically shorting, the plurality of source select gate electrodes. The plurality of source select gate electrodes within lower level electrically conductive layer 44 can include source select gate electrodes located at the same level for the vertical memory devices including the memory stack structures 55. In other words, each lower level electrically conductive layer 44 can be a source select line that functions as a common source select gate electrode for the plurality of vertical memory devices.

Each upper level electrically conductive layer 48 can function as a combination of a plurality of drain select gate electrodes and a drain select line electrically connecting, i.e., electrically shorting, the plurality of drain select gate electrodes. The plurality of drain select gate electrodes within upper level electrically conductive layer 48 can include drain select gate electrodes located at the same level for the vertical memory devices including the memory stack structures 55. In other words, each upper level electrically conductive layer 48 can be a drain select line that functions as a common drain select gate electrode for the plurality of vertical memory devices. An insulating spacer and a backside contact via structure can be formed in the same manner as in the first embodiment.

Figure 22:
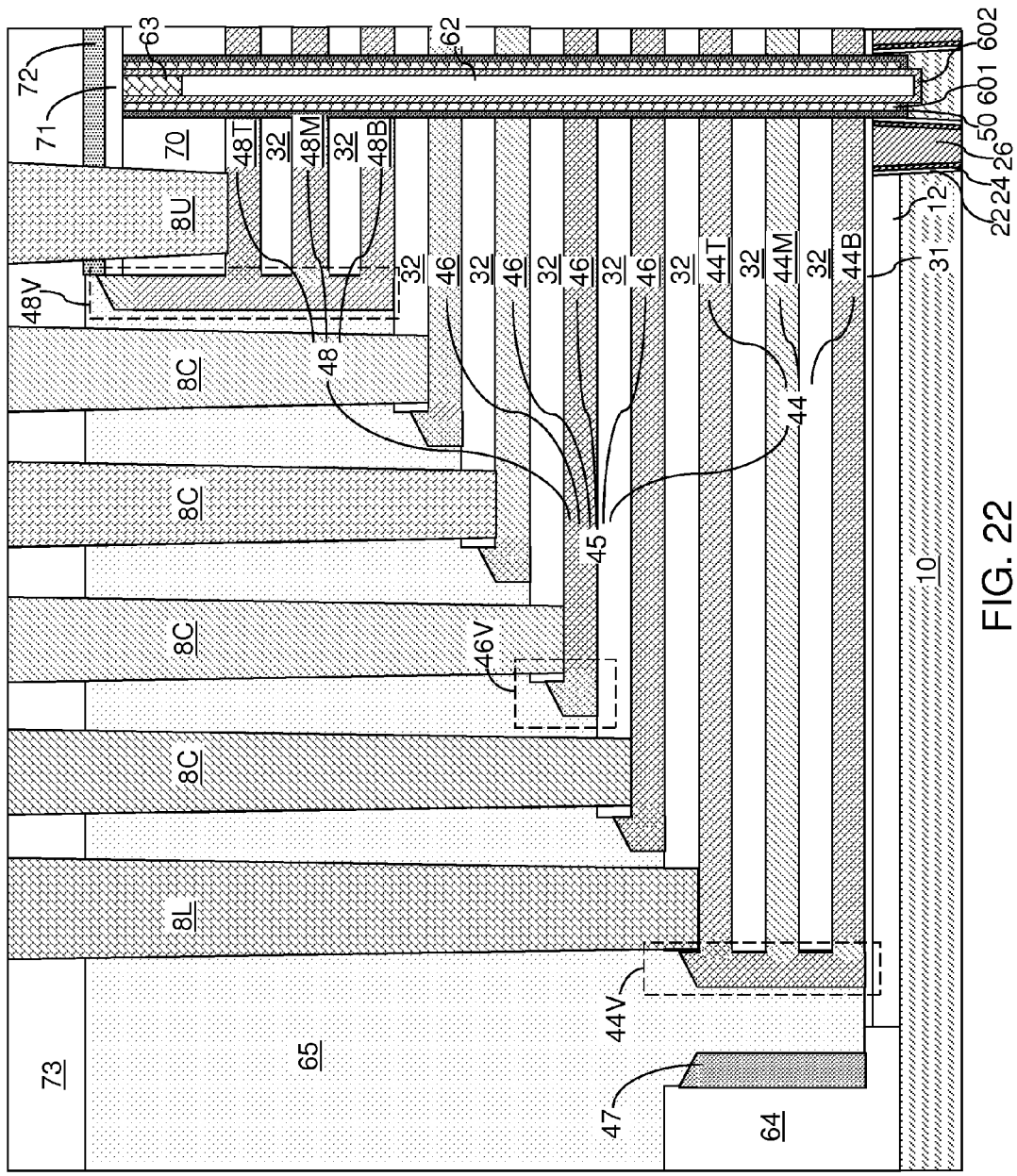
FIG. 22 is a vertical cross-sectional view of the second exemplary structure after formation of contact via structures according to the second embodiment of the present disclosure.

Referring to FIG. 22, contact via structures (8L, 8C, 8U) contacting the electrically conductive layers 45 can be formed prior to, concurrently with, or after, formation of the backside contact via structure by deposition and planarization of a conductive material. The same processing steps can be employed as the processing steps of FIGS. 12A, 12B, and 13 according to the first embodiment.

For example, a photoresist layer can be applied over the topmost layer of the exemplary structure (which can be, for example, the dielectric pillar material layer 73), and can be lithographically patterned to form opening therein. In one embodiment, the locations and sizes of the openings through the photoresist layer can be selected such that a plurality of first-type openings are formed so that each area of the opening is entirely within an area of a horizontal step of an insulator layer 32 contacting a top surface of a control gate level electrically conductive layers 46.

In one embodiment, the shapes of the first-type openings can be substantially circular or substantially elliptical. In one embodiment, the plurality of first-type openings can be arranged as a linear array or an m×n two-dimensional rectangular array. A second-type opening can be formed in the photoresist layer such that the area of the opening overlies a vertical sidewall of the topmost lower level electrically conductive layer 44T. A third-type opening can be formed in the photoresist layer such that the area of the opening overlies a vertical sidewall of the topmost level electrically conductive layer 48T. The shapes and the locations of the first-type openings can be the same as in the first embodiment. The shapes of the second-type opening and the third-type opening can be the same as in the first embodiment. The location of the second-type opening can be selected not to overlap with the areas of the control gate level electrically conductive layers 46. The location of the third-type opening can be selected so that the entire area of the opening overlaps with the area of the upper level electrically conductive layers 48.

The pattern in the photoresist layer 87 is transferred through the dielectric pillar material layer 73, the retro-stepped dielectric material portion 65, and a single insulator layer 32 by an anisotropic etch. Portions of the at least one dielectric cap layer (71, 72) and the insulating cap layer 70 can be etched underneath the third-type opening in the photoresist layer. Various contact via cavities extending to a top surface of an electrically conductive layer 45 can be formed.

A conductive material can be deposited in the contact via cavities, for example, by chemical vapor deposition, physical vapor deposition, electroplating, electroless plating, or a combination thereof. Deposition of the conductive material in the various contact via cavities can be performed in a separate processing step, or in conjunction with deposition of the conductive material in other types of contact via cavities such as the backside contact cavity and/or contact via cavities (not shown) for peripheral devices. Various contact via structures (8U, 8C, 8L) can be formed in the contact via cavities. The contact via structures include control gate contact via structures 8C that contact a top surface of a respective control gate level electrically conductive layer 46, a lower level contact via structure 8L that contacts a top surface of a topmost lower level electrically conductive layer 44T and/or a surface of the bottommost conductive material spacer 44V, and an upper level contact via structure 8U that contact a top surface of a topmost upper level electrically conductive layer 48T and/or a surface of the topmost conductive material spacer 48V.

The second exemplary structure includes a multilevel structure, which comprises a stack (32, 45) of an alternating plurality of electrically conductive layers 45 and insulator layers 32 located over a substrate (9, 10), a plurality of contact via structures (such as the control gate contact via structures 8C, the lower level contact via structure 8L, and the upper level contact via structure 8U) having bottom surfaces contacting a respective electrically conductive layer (such as the control gate level electrically conductive layer 46, the topmost lower level electrically conductive layer 44T, and the topmost upper level electrically conductive layer 48T) located at different levels. The multilevel structure further comprises a vertically extending conductive material portion (such as the bottommost electrically conductive spacer 44V or the topmost electrically conductive spacer 48V) contacting at least two electrically conductive layers (which can be the lower level electrically conductive layers 44 or the upper level electrically conductive layers 48), and contacting each sidewall of at least one intervening insulator layer 32 that is located between a topmost electrically conductive layer among the at least two electrically conductive layers (which is either the topmost lower level electrically conductive layer 44T or the topmost upper level electrically conductive layer 48T) and a bottommost electrically conductive layer among the at least two electrically conductive layers (which is either the bottommost lower level electrically conductive layer 44B or the bottommost upper level electrically conductive layer 48B).

A subset 46 of the electrically conductive layers 45 comprises control gate electrodes for the at least one memory stack structure 55. The at least two electrically conductive layers (44 or 48) can comprise select gate electrodes located above, or underneath, the control gate electrodes. Specifically, the lower level electrically conductive layers 44 can comprise lower level select gate electrodes located below the control gate electrodes. The lower level electrically conductive layers 44 can comprise source select gate electrodes, which can be employed to select a semiconductor channel (601, 602) to be activated from the source side. The upper level electrically conductive layers 48 can comprise upper level select gate electrodes located above the control gate electrodes. The upper level electrically conductive layers 48 can comprise drain select gate electrodes, which can be employed to select a semiconductor channel (601, 602) to be activated from the drain side.

Each control gate contact via structure 8C contacts, and vertically extends above, a respective electrically conductive layer, i.e., a control gate electrically conductive layer 46, within the subset of electrically conductive layers 45. Each select gate contact via structure (8L or 8U) is electrically shorted to the at least two electrically conductive layers (44 or 48) and has a greater lateral extent along a horizontal step direction than a maximum lateral extent of any of the control gate contact via structures 8C along the horizontal direction. The horizontal step direction provides a least horizontal distance between a pair of sidewalls (within a set of stepped surfaces) that adjoin a common horizontal step surface (which is selected from the set of stepped surfaces).

In one embodiment, the device located over the semiconductor substrate can include a vertical NAND device located in the device region, and at least one of the electrically conductive layers 46 in the stack (32, 45) can comprise, or can be electrically connected to, a word line of the NAND device. The device region can include a plurality of semiconductor channels (601, 602). At least one end portion of each of the plurality of semiconductor channels (601, 602) extends substantially perpendicular to a top surface of the semiconductor substrate. The device region further includes a plurality of charge storage regions located within each memory film 50. Each charge storage region is located adjacent to a respective one of the plurality of semiconductor channels (601, 602). The device region further includes a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The plurality of electrically conductive layers 46 in the stack (32, 45) can be in electrical contact with, or can comprise, the plurality of control gate electrodes, and extends from the device region to a contact region including a plurality of electrically conductive contact via structures.

In case the exemplary structure includes a three-dimensional NAND device, a stack (32, 45) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 45). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 45).

In a non-limiting illustrative example, the insulating layers 32 can comprise silicon oxide layers, the plurality of word lines 46 can comprise tungsten or a combination of titanium nitride and tungsten, the at least one charge storage region can comprises a tunneling dielectric, a blocking dielectric layer, and either a plurality of floating gates or a charge trapping layer located between the tunneling dielectric layer and the blocking dielectric layer. An end portion of each of the plurality of word lines 46 in a device region can comprise a control gate electrode located adjacent to the at least one charge storage region. A plurality of contact via structures contacting the word lines 46 can be located in a contact region. The plurality of word lines 46 extends from the device region to the contact region.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A multilevel structure, comprising:
a stack of an alternating plurality of electrically conductive layers and insulator layers located over a substrate;
a plurality of contact via structures having bottom surfaces contacting a respective electrically conductive layer located at different levels; and
a vertically extending conductive material portion contacting at least two electrically conductive layers and contacting each sidewall of at least one intervening insulator layer that is located between a topmost electrically conductive layer among the at least two electrically conductive layers and a bottommost electrically conductive layer among the at least two electrically conductive layers;
wherein the vertically extending conductive material portion is a conductive material spacer having a same composition with the electrically conductive layers within the stack.

2. The multilevel structure of claim 1, wherein the at least one intervening insulator layer comprises a plurality of intervening insulator layers having sidewalls that are vertically coincident among one another.

3. The multilevel structure of claim 1, wherein the conductive material spacer is of integral construction with an entirety of the at least two electrically conductive layers.

4. The multilevel structure of claim 1, wherein a portion of the electrically conductive via contacts a top surface of the topmost electrically conductive layer among the at least two electrically conductive layers.

5. The multilevel structure of claim 1, wherein the vertically extending conductive material portion is of integral construction with the at least two electrically conductive layers without any interface between the vertically extending conductive material portion and the at least two electrically conductive layers.

6. The multilevel structure of claim 1, further comprising:
a stepped dielectric material portion located on the substrate; and
a spacer located on the stepped dielectric material portion and having a same thickness as, and having a different composition from, the vertically extending conductive material portion.

7. The multilevel structure of claim 1, wherein the multilevel structure comprises at least one memory stack structure embedded within the stack, and a subset of the electrically conductive layers comprises control gate electrodes for the at least one memory stack structure, and the at least two electrically conductive layers comprise select gate electrodes located above, or underneath, the control gate electrodes.

8. The multilevel structure of claim 7, further comprising:
control gate contact via structures contacting, and vertically extending above, a respective electrically conductive layer within the subset of electrically conductive layers;
a select gate contact via structure contacting the at least two electrically conductive layers and having a greater lateral extent along a horizontal direction than a maximum lateral extent of any of the control gate contact via structures along the horizontal direction.

9. The multilevel structure of claim 1, further comprising a second vertically extending conductive material portion contacting at least two additional electrically conductive layers and contacting each sidewall of at least one additional intervening insulator layer that is located between a topmost electrically conductive layer among the at least two additional electrically conductive layers and a bottommost electrically conductive layer among the at least two additional electrically conductive layers, wherein:
a subset of the electrically conductive layers comprises control gate electrodes for the at least one memory stack structure;
the at least two electrically conductive layers comprise upper select gate electrodes located above the control gate electrodes; and
the at least two additional electrically conductive layers comprise lower select gate electrodes located below the control gate electrodes.

10. The multilevel structure of claim 9, wherein:
the multilevel structure comprises a vertical NAND device is located over the substrate; and
the electrically conductive layers comprise, or are electrically connected to a respective word line of the NAND device.

11. The semiconductor structure of claim 10, wherein:
the substrate comprises a silicon substrate;
the NAND device comprises an array of monolithic three dimensional NAND strings over the silicon substrate;
at least one memory cell in the first device level of the three dimensional array of NAND strings is located over another memory cell in the second device level of the three dimensional array of NAND strings;
the silicon substrate contains an integrated circuit comprising a driver circuit for the memory device located thereon; and
each NAND string comprises:
a plurality of semiconductor channels, wherein at least one end portion of each of the plurality of semiconductor channels extends substantially perpendicular to a top surface of the semiconductor substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *